United States Patent [19]

Pray et al.

[11] Patent Number: 4,885,694

[45] Date of Patent: Dec. 5, 1989

[54] AUTOMATED BUILDING CONTROL DESIGN SYSTEM

[75] Inventors: Robert H. Pray, Minneapolis; Donald W. Ramler, Cottage Grove; Curtis B. Juliber, St. Paul, all of Minn.

[73] Assignee: Honeywell Inc., Minneapolis, Minn.

[21] Appl. No.: 44,079

[22] Filed: Apr. 29, 1987

[51] Int. Cl.[4] .............................................. G06F 15/60
[52] U.S. Cl. .............................. 364/464.01; 364/188; 364/512; 364/521
[58] Field of Search ............... 364/188, 189, 190, 192, 364/464, 512, 518, 521, 464.01

[56] References Cited

U.S. PATENT DOCUMENTS

| | | | |
|---|---|---|---|
| 3,867,616 | 2/1975 | Korelitz et al. | 364/189 X |
| 4,181,954 | 1/1980 | Rosenthal et al. | 364/512 X |
| 4,451,895 | 5/1984 | Sliwkowski | 364/188 X |
| 4,551,810 | 11/1985 | Levine | 364/512 X |
| 4,578,768 | 3/1986 | Racine | 364/464 X |
| 4,616,327 | 10/1986 | Rosewarne et al. | 364/518 |
| 4,622,641 | 11/1986 | Stephens | 364/188 X |
| 4,644,478 | 2/1987 | Stephens et al. | 364/188 X |
| 4,665,501 | 5/1987 | Saldin et al. | 364/518 X |
| 4,700,317 | 10/1987 | Watanabe et al. | 364/512 X |
| 4,700,318 | 10/1987 | Ockman | 364/518 |
| 4,716,542 | 12/1987 | Peltz et al. | 364/188 X |
| 4,731,609 | 3/1988 | Reynolds et al. | 364/521 X |
| 4,744,034 | 5/1988 | Milstein | 364/464.01 |
| 4,782,448 | 11/1988 | Milstein | 364/464.01 |

Primary Examiner—Parshotam S. Lall
Assistant Examiner—Edward R. Cosimano
Attorney, Agent, or Firm—Donald J. Lenkszus

[57] ABSTRACT

Disclosed is a computer system for substantially automating the design of a building control system. The system comprises a processor for processing data stored in a data base, the data being related to a building control system design and comprising both graphic and alpha-numeric information. The processor comprises the ability to call up on a display an initial drawing related to a building control system element. The initial drawing comprises graphic and related alpha-numeric information including an identifier associated with the element and a prompt guiding modification of the initial drawing. The processor also includes the ability to create a modified drawing by incorporating changes into the initial drawing, the modified drawing being related to a building control system design.

101 Claims, 18 Drawing Sheets

4,885,694

AUTOMATED BUILDING CONTROL DESIGN SYSTEM

BACKGROUND OF THE INVENTION

The present invention relates to the automated design of building control systems. Such systems can relate, for example, to building heating, ventilating, and air conditioning, as well as to other building control and monitoring functions such as building energy management systems, building fire and security systems, and other allied building control systems.

In the prior art, such systems have typically been designed manually using pencil, paper, manuals, texts and many man hours of arduous labor. Furthermore, when a supplier in the prior art designed a building control system, its personnel manually accomplished most of the related engineering, job estimating, customer proposals, job bookkeeping, system component ordering, drawing drafting, job labor scheduling, job billing processing, job recording, and other general administrative matters.

The present invention substantially automates building control system design. Preferred embodiments of the present invention substantially automate all of the previously listed tasks.

SUMMARY OF THE INVENTION

The present invention is a computer system for substantially automating the design of a building control system. The invention comprises a processor for processing data stored in a data base, the data being related to a building control system design and comprising both graphic and alpha-numeric information. The processor comprises the ability to call up on a display an initial drawing related to a building control system element. The initial drawing comprises graphic and related alpha-numeric information including an identifier associated with the element and a prompt guiding modification of the initial drawing. The processor also includes the ability to create a modified drawing by incorporating changes into the initial drawing, the modified drawing being related to a building control system design.

BRIEF DESCRIPTION OF THE DRAWINGS

The following is a brief description of the drawings wherein like numerals refer to like elements herein.

DETAILED DESCRIPTION OF THE PREFERRED EMBODIMENTS

Figure 1:
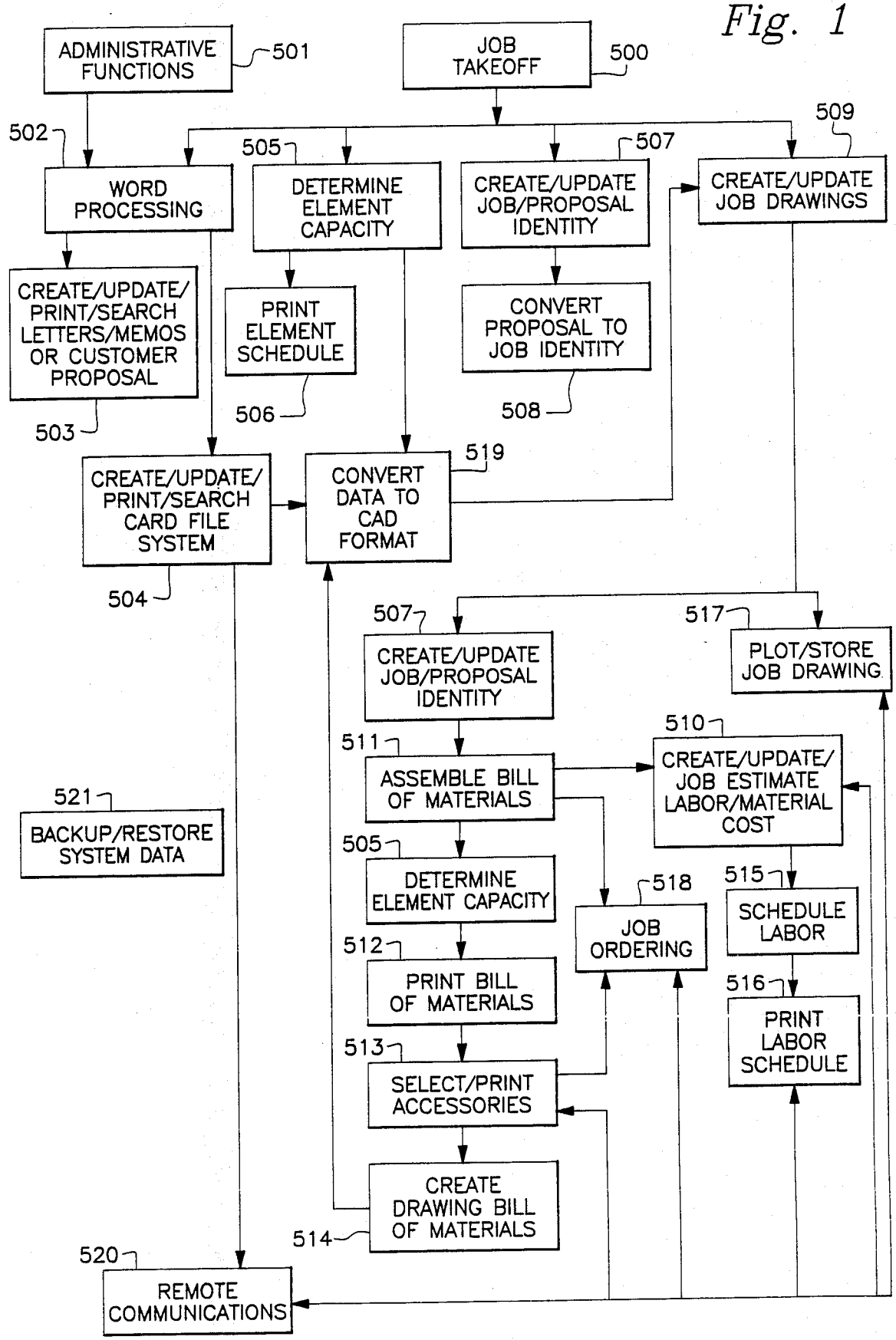
FIG. 1 is a block diagram illustrating a preferred embodiment of the present invention.

The FIG. 1 block diagram shows a preferred embodiment of a data processing system for automatically designing a building control system. The preferred embodiment of the present invention substantially automates the building control system design function and includes estimating, preparing a proposal to a prospective customer, creating a job file, drafting, creating a bill of materials, record keeping, labor scheduling, communications, ordering and other administrative functions.

Accordingly, in the preferred embodiment, there are many functions offered to system users of the present invention. A basic function, however comprises designing and drafting in order to generate a schematic drawing of a desired building control system. As previously indicated, the present system can also be configured so that equipment requirements are automatically itemized on a bill of materials, installation and engineering labor are automatically determined, and the dollar value of installation material is automatically determined. Job proposal processing, which comprises selecting proposals from a forms data base and automatically modifying and producing them, may also be integrated with the present system. Labor scheduling may also be incorporated so that, for example, manpower requirements are automatically displayed for a requested time period for single or multiple jobs. Ordering materials including the devices required for installation of a building control system which has been designed by the present invention may also be substantially automated by generating purchase orders from information automatically extracted from a bill of materials generated by the present system. The present system may also comprise a job billing function wherein a bill form is selected from a forms data base, automatically modified, and sent to the customer. Record keeping may also be integrated with the present system so that correspondence is automatically updated and maintained. The present system may also comprise a function for automatic backup or restoration of all information in the system such as drawings, memoranda and proposals. The present system may also be configured to operate in remote locations and networked with other remote locations or with a central location for transmitting such things as building control system design data, manpower requirements, and material orders between locations.

The finished system drawing or series of drawings provided by the present invention typically includes all elements of a building control system designed for a particular customer. For example, the drawing or series of drawings could include all electronic, automation, fire and security, and pneumatic systems necessary to meet a system specification. Electronic systems, for example, could include temperature, humidity and pressure sensors, automatic controllers, and software modules. Automation systems, by way of example, could include central control monitoring and control equipment for maintenance scheduling, management reporting of energy consumption, or monitoring temperatures for danger levels such as temperatures less than thirty-two degrees in areas with water pipes. Fire and security systems could include systems for fire and smoke detection and control as well as the systems necessary for detecting and preventing unauthorized access or entrances. Pneumatic systems are typically environmental control systems which make use of temperature, humidity and pressure controls. Electronic, automatic, pneumatic and fire and security systems typically employ wire and cabling for interconnection and pneumatic systems also employ pneumatic (compressed air) piping for interconnection.

To implement an automated building control system design process, the present system typically comprises generalized software packages. These include a menu software package (such as the package sold by Magee Enterprises under the trademark "Automenu"); word processing programs (such as Ashton-Tate's product sold under the trademark "Multimate Advantage") capable of importing text from, and exporting text to, other programs; a filing system program (such as Ashton-Tate's product sold under the trademark "On-File") capable of importing text from other programs, sorting, filing, indexing, searching, and displaying or printing selected items; a Computer Aided Design (CAD) package (such as Autodesk Inc.'s product sold under the trademark "AutoCAD") with features of menu customization, engineering symbol customization, and the ability to import files from, and export files to, other programs, and to print drawings utilizing a device such as a plotter or dot matrix printer; if the CAD package does not contain its own, a conversion package (such as the Technical Software, Inc. product sold under the trademark "AutoWord") for converting files to be imported into a CAD package; a data base package (such as the AshtonTate product sold under the trademark "dBase III+") capable of importing files from, and exporting files to, other programs in addition to customization features such as setting up records or making calculations based on data in records contained in a data base; a generalized spreadsheet (such as the Microsoft Corporation product sold under the trademark "MultiPlan"); a communications package (such as the DTSS Incorporated product sold under the trademark "DaTapaSS"); a cartridge tape backup package (such as the Colorado Memory Systems, Inc. product sold under the trademark QIC-60 Tape Back up System and operating system software (such as Microsoft Corporation's product sold under the trademark "MS-DOS").

It is recognized by those skilled in the art that the functions included in the present system can be achieved with many different programs other than the specific programs described in the present application, and that these functions can be combined in many different ways to constitute one or more computer programs for implementing the present system.

As can be seen with reference to FIG. 1, the above listed known programs operate as one unit to implement the invention. As can be seen with reference to FIG. 1 and the other Figures, these programs when combined with the appropriate data bases substantially automate the design of a building control system. Examples and details of the functional operation of the invention herein below further illustrate the cooperation between these elements. In order to better understand the manner in which this cooperation is achieved in invention, the following example is interposed prior to explaining the invention in detail. As can be seen in FIG. 1, the word processing program at Block 502 cooperates with the administrative functions Block 501, receiving inputs from that Block, as well as from the job take-off function 500. The word processing program supplies data to Blocks 503 and 504 for creating, updating, printing and searching various documents and/or a card file system. The menu program is used throughout, as exemplified in the various Figures, to generate many different menus. See, for example, menu 320 in FIG. 6 and menu 410 in FIG. 7. A filing system program is also used throughout the system to import text from other programs, sorting, filing, indexing, searching and displaying for printing selected items as shown, for example, in Blocks 503, 504, 516 and generally throughout the system. The CAD package of the system is mainly used to create and update job drawings, as in Block 509 and to plot and store such job drawings as shown in Block 517. The CAD system accepts data converted to CAD format from the bill of materials in Block 514 and the card file system in Block 504 as well as element capacity information from Block 505 and initial information from the job take-off Block 500. As also shown inherently in FIG. 1, the data base package is used extensively throughout the system by the various functional blocks to, for example, assemble the bill of materials as shown in Block 511 or create and update labor and material costs as shown in Block 510. The generalized spreadsheet program is used in, for example Block 510 to create and update the job estimate for labor and material costs. As is known by those skilled in the art, such spreadsheet programs contain the ability to make such calculations on a routine basis. The communications package may be included in the system in order to enable the user to obtain information from locations or data bases which are at a remote location. This information could be inputted at various points in the system including the job take-off point Block 500. The cartridge tape backup package would be used in connection with the backup/restore system data function Block 521. With reference to the flow of information shown in FIG. 1, those skilled in the art will readily appreciate that the above-listed programs cooperate to substantially automate the design of a building control system.

Figure 2:
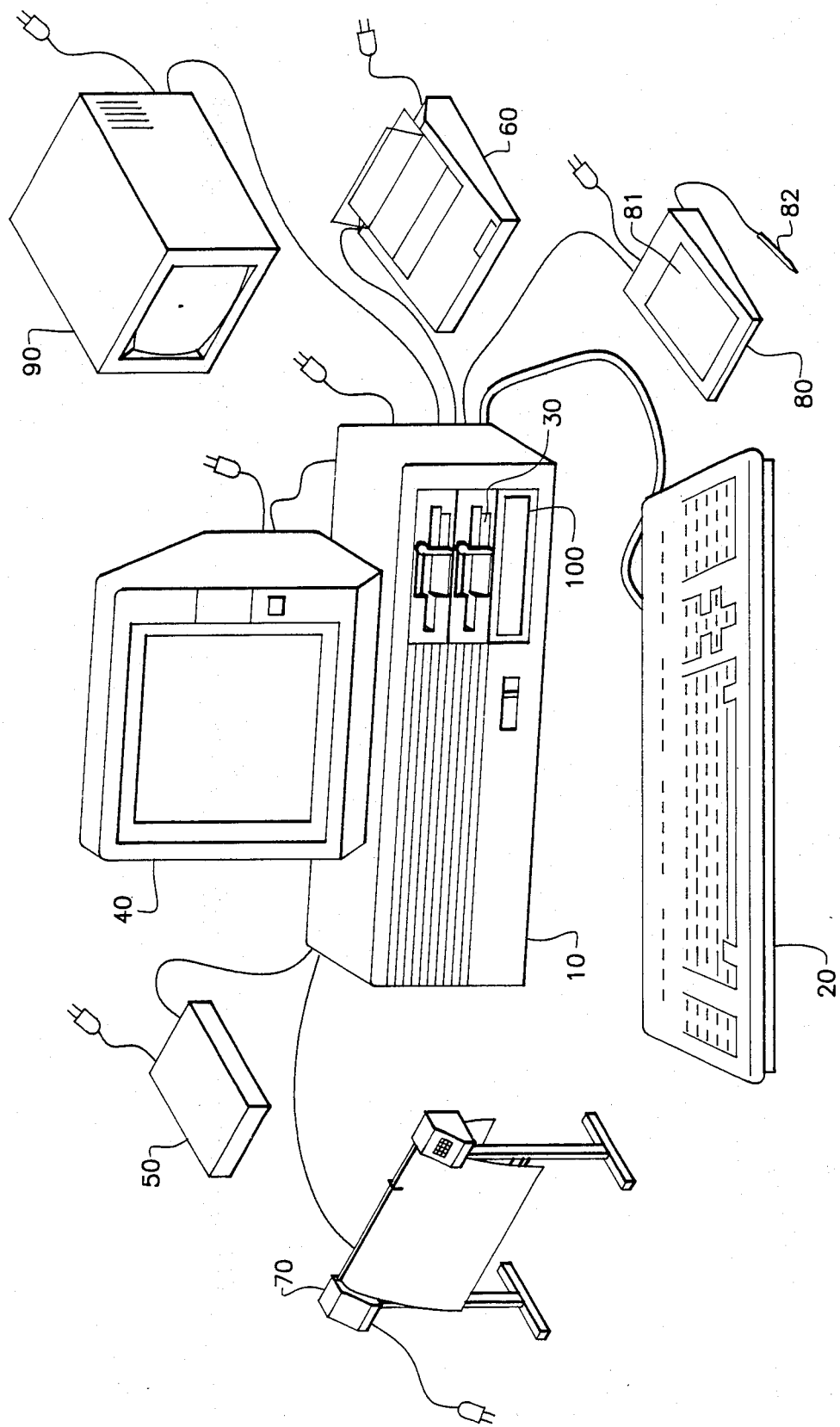
FIG. 2 illustrates typical hardware used in conjunction with the present invention.

Typical hardware for the present system is illustrated in FIG. 2. The hardware may comprise a personal computer 10 with hard disk and floppy drive, a keyboard 20, an additional floppy drive 30, a display device 40, a modem 50, a printer 60, a plotter 70, a digitizer 80, a graphics display with video driver board 90, and backup tape system 100. Such a system could comprise the following specific hardware.

The personal computer could comprise a Honeywell Inc. Personal Computer with math co-processor, e.g. an HWS 0670AP with an Intel 80287-8 co-processor, and 128KB memory chip package, e.g., a CMM 0702. If more memory is needed, the Honeywell AP PC has 512K memory expandable to 640K by a memory chip; other, larger capacity systems are also available as desired.

Other components could comprise a Honeywell keyboard, (e.g., an APD K0782); a Honeywell 1.2 MB floppy drive (e.g., a DIU 0703); a Honeywell monochrome monitor for text (e.g., a DMU 0794); a Hayes 2400 Baud modem (e.g. a DCD 1202); a Brothers letter quality printer (e.g., an HR15); a Houston Instruments plotter (e.g., a DMP 51); a Hitachi digitizer (e.g., a HDG 111lB); a Control Systems, Inc. monochrome graphics monitor and controller board (e.g., a package sold under the trademark "Artist TM Monochrome System 64"); a Colorado Memory Systems, Inc. 60 megabyte cartridge tape drive with driver board (e.g., a QIC-60 Tape Backup System), a Honeywell monitor controller board for monochrome monitor (e.g., a CPA 0798), and two Honeywell serial/parallel boards (e.g., two DCM 0701's), one for the plotter and the printer and the other for the digitizer.

It is recognized by those skilled in the art that other compatible equipment is available. It is also recognized by those skilled in the art that one display device could be used rather than using two display devices 40 and 90; in such a configuration, the information which would otherwise appear on the separate devices would appear in alternating or other fashion (e.g., using a split display or windowing) on the same device.

Figure 3:
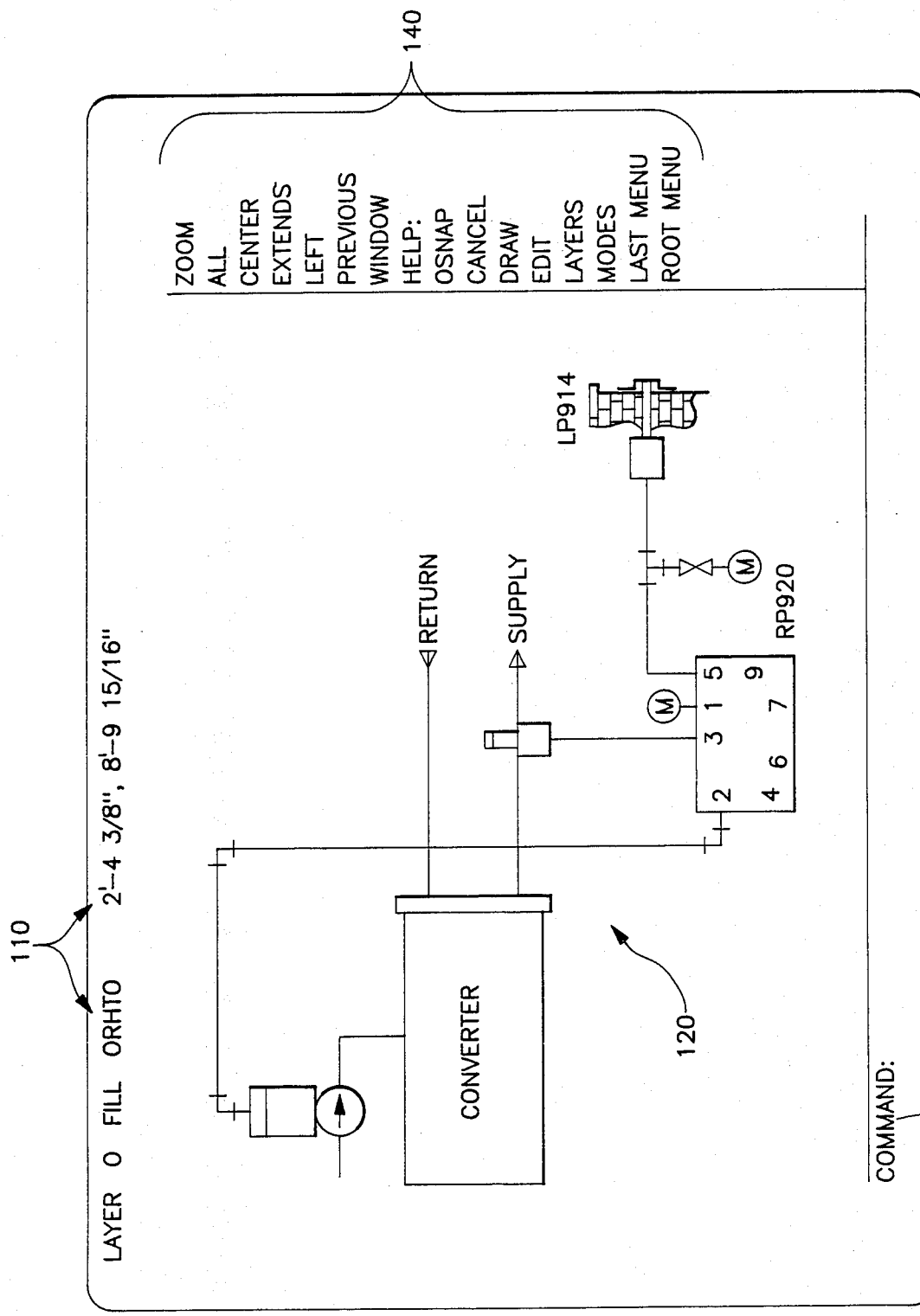
FIG. 3 is an example of a display screen related to a building control system design.

When the two display devices 40 and 90 of FIG. 2 are used, typically one is used for a display such as shown in FIG. 3, which illustrates a building control system drawing 120, a prompt line 130 (indicating what input information is expected, for example, "Command:" displays), a menu 140 of functions, and a status line 110 which may indicate CAD drawing user information.

The other display device 40 is typically used to log commands entered by a system user and to provide help messages to the user. In addition, screen 40 is typically used for word processing, working on spread sheets, and editing menu and help message files. Further, when commands are entered by a user, a command log typically appears on screen 40. The command log normally lists the commands in the order they are entered; when the screen space available for commands is full, the oldest command is normally scrolled off the top of the screen, and the new command is added to the bottom of the list.

Help messages provide the user with specific information about building control systems and the elements contained in drawings such as the drawing illustrated in FIG. 3. When help messages fill a significant portion of a screen, they are most conveniently displayed on screen 40, i.e., on a screen separate from graphic screen 90. Help messages are typically entered or edited through the use of a text editor such as Microsoft Corporation's text editor identified with the trademark "EDLIN". Such text editors are a component of operating systems such as Microsoft Corporation's product sold under the trademark "MS-DOS". The help messages are typically maintained in a computer aided design package file such as the ACAD.HLP file found in Autodesk Inc.'s product identified under the trademark "AutoCAD".

In the present application, the term "prompt" is used to refer to all substantially automated forms of assistance which are given to the user of the present system and which help determine which action to take next. This includes such things as help messages, prompt lines, menus, status lines and command logs. Prompt information in help messages and menu displays can contain both standard building control system information as well as specific customer-related design information which is unique to a particular job or customer; for example, such a prompt could include information related to a nonstandard alarm circuit.

The following discussion provides a brief overview of the preferred embodiment as depicted in FIG. 1. This will be followed by a detailed discussion of each block in FIG. 1.

For the preferred embodiment of the present system as shown in FIG. 1, there are typically at least two different types of system users. One such user is a salesperson who is primarily interested in the system job estimating capability, i.e., in the ability of the preferred embodiment of the present system to estimate the cost of a building control system meeting the specific needs of a particular customer; another typical system user is an engineer, who is primarily interested in the system job engineering capability, i.e., in the ability of the preferred embodiment to design and implement installation of a particular building control system. In the smallest remote business locations, both users, e.g., salesperson and engineer, are the same person, performing job estimating and engineering in successive stages.

With the above in mind, flow in FIG. 1 can originate from several points. Typically, however, either of the two user types mentioned above will begin with job takeoff, shown in block 500, which is the gathering and the interpreting of building control system information from job plans and specifications, i.e., from the customer's statement of particular building control system requirements.

Both of these users make use of the preferred embodiment of the present invention to automatically select an initial drawing related to a building control system element, the element comprising one or more drawing symbols contained in a data base comprising graphic symbols. Such elements can represent single devices, a building control subsystem, or even an entire system; further, the elements can comprise either standard system elements or elements which have been customized for particular customer needs, locations, and the like.

These standard or customized building control system elements, e.g., control devices, can then be combined or otherwise modified through the present invention to create a modified drawing of a building control system meeting job specifications.

When using the present system, a salesman will typically be finished in block 510 when the job estimate is completed and ready to bid to a customer; an engineer will typically be done when job installation drawings are ready for distribution, block 517, labor is scheduled, block 515, and orders are placed for all the required controls and installation materials, block 518.

In other words, in a typical project, the preferred embodiment of the present system is used to estimate and bid the job and then, as soon as an order is received, the job proposal (estimate) is converted into a job file in block 508. Then the engineer will typically compare the salesman's job takeoff with the most current job plans and specifications and modify any necessary details in the building control system, distribute finalized job drawings, schedule installation labor, and order all of the required materials. While these uses are typical, many other uses of the present system will be recognized by those skilled in the art.

Block 510, job estimating, may consist of three optional functions. These are the creating or updating of a bill of materials; calculation of installation and engineering labor; and calculation of the dollar value of the installation material. A typical bill of materials is an itemized listing of all components required to meet the specifications for a building control system. This can be accomplished by automatically transferring information compiled in block 511, bill of materials assembly, to a data base for the tabulation and generation of the bill of materials for use in estimating a job cost.

The information gathered in block 500, job takeoff, or block 511, assemble bill of materials, may also be used as input for other optional application programs such as an optional block 505 program for sizing an element; block 505 sizing programs may typically be written for any element which must be sized as part of designing the element into a building control system, for example, a specialized optional program for compressor sizing in pneumatic systems.

By way of a further example, in building control systems which include an environmental control system, e.g., systems which use water or steam for temperature control, valves and actuators must normally be sized, and a valve schedule or list is typically required. The valve schedule for such a system lists appropriate valves and/or valve actuator quantities, sizes, capacities and job site physical location.

A similar sizing program can be implemented for sizing dampers and for generating damper schedules listing dampers required for a particular system. Other applications for sizing programs, such as sizing power supplies required for fire and security systems, will be recognized by those skilled in the art.

Block 513 depicts a user option for choosing accessories for a device listed on the bill of materials. The accessories can be separately printed (in hard copy form or on electronic media) or passed to the ordering system in block 518 for procurement.

Block 518 provides an option for automatically placing job orders. A job order normally specifies what devices must be ordered to install a building control system described in a system drawing or series of drawings. The ordering system option as shown in block 518 typically takes information from the block 511 bill of materials program and the block 513 accessory program, and performs order entry. Typical order entry functions include information such as where to ship the building control system components and how to group the components for multiple shipments. If the devices are stocked by the building control system supplier, the order is typically electronically transmitted to the appropriate supplier sourcing location. If it is not a supplier-stocked component, a vendor purchase order is transmitted, e.g., by modem or hard copy.

A block 514 option allows the user to create a complete bill of materials. In the preferred embodiment, a bill of materials is typically created in block 514, transferred to the job drawing, block 517, through the use of a block 519 conversion program, and stored on a drawing page basis within a job or proposal. Block 512 gives the user an option for printing a hard copy (or a copy on electronic media) of the bill of materials and/or for inserting the bill of materials on a job drawing.

Block 507 optionally creates and maintains information on job proposals and sold jobs. Accordingly, block 507 may be used to create a record referred to as a job file, which typically contains all job information such as job drawings, job bid information, bill of materials, damper and valve schedules, labor schedules, etc.

Block 502 represents an optional generalized word processing package. The package is used for typical secretarial functions such as customer correspondence. It may also be used to compose, modify or print (on hard copy or electronic media) form letters for job proposals, billing and sales reports as shown in block 503. It can additionally be used for storage of standard control sequences of operation optionally created in block 504 (a sequence of operation is a textual explanation which shows the building owner how a building control system operates, e.g., the order in which mechanical and control functions should occur).

A block 515 option may comprise a spreadsheet template program which assists the user in scheduling the construction labor necessary to install a building control system. This facilitates planning for the correct number of the required kinds of workers for a particular job at the appropriate time in the construction cycle. This information can also be transferred to a central location for overall coordination of workers. The labor schedule can then be printed, as shown in block 516, on hard copy or electronic media or transmitted, e.g., by modem 50, to a desired location.

In block 517, the user has the option of printing the drawings and associated information such as sequences of operation and a bill of materials in hard copy form or on electronic media. This will typically be done at the completion of a design.

The user also has an option in block 521 to back up the system for data security purposes, for example. This would typically be done after the completion of a design or on a periodic basic. The system data can then be easily restored in the event of data destruction.

Block 520 provides a remote communications capability. This enables remote locations to send and receive any information contained within the system to and from other remote locations as well as to and from a central location. Thus, more experienced remote locations can support less experienced remote locations, for example.

Block 501, entitled "Administrative Functions" comprises administrative functions generally understood by those skilled in the art including software updates, archiving job files, making daily tape back-ups and other administrative functions generally inherent in computer systems.

Block 506 represents an option whereby the user can obtain a printout of element schedules.

Block 507 optionally creates or updates job proposal records and/or sold job records. Block 507 is explained in further detail below with reference to FIG. 9.

Block 508 represents an option whereby the user can convert job proposals into a job file. This file conversion would take place as soon as an order is received.

Block 509 creates and updates job drawings as each symbol or element is stored within the data base or CAD system as a drawing. Block 509 is discussed in further detail below with reference to FIG. 8.

Figure 5:
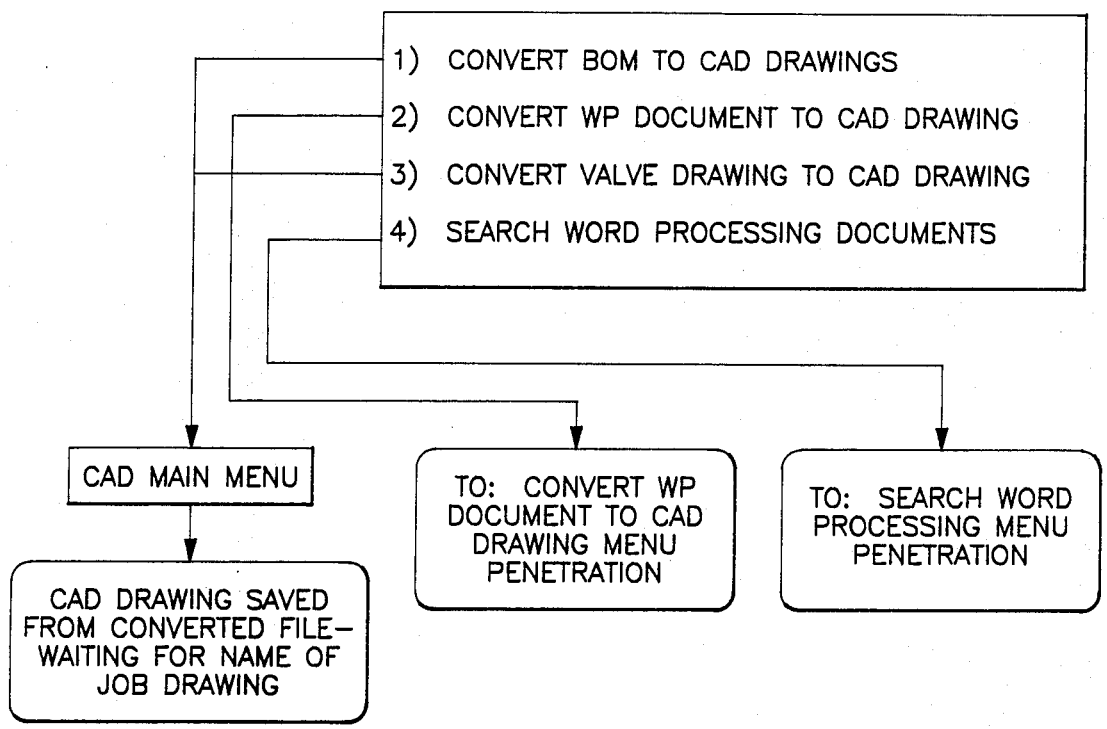
FIG. 5 is a flow chart which shows in block diagram form a typical menu penetration procedure for implementing conversion of data, including BOM data, to CAD format using documents in the system according to a scheme of the invention.

Block 519 converts data from Block 504 or Block 514 to CAD format which is then used by Block 509 to create and/or update job drawings. An example of the use of this option for converting a bill of materials to CAD drawings is shown in FIG. 5.

Block 521 provides the user with an option to backup the system for data security purposes. This is discussed in more detail below with reference to FIG. 14.

With the above overview in mind, a more detailed description follows. As previously indicated, a system comprising the present invention typically employs symbols in drawing form which represent the elements of a building control system. These symbols or combinations of symbols can be called to a screen, together with simultaneously displayed alpha-numeric information, in order to substantially automate the design of a building control system through the present invention.

Graphic symbols stored in a data base or a Computer Aided Design (CAD) package can be used for representing such things as dampers, fans, sheet metal duct work and air compressors. Symbols can represent, or can be combined to represent, each control or mechanical device used in a building control system. FIG. 3 represents a sample building control system drawing comprised of symbols on a display screen, the symbols representing elements of the building control system. Thus, FIG. 3 is an example of a drawing related to a building control system element; within the present invention, such a drawing or element may comprise a single element or component of a building control system, or it may represent a combination of such elements or devices, e.g., it may represent a building control subsystem or system.

To design a system comprising the present invention, a generalized CAD system (such as AutoDesk Inc.'s product sold under the trademark "AutoCAD") may be employed. The designer of a system comprising the present invention needs to determine which symbols will be necessary to represent building control system elements. Symbols representing these elements are then drafted by the designer of the system, are entered into a data base or CAD system capable of maintaining such graphics, and are then preferably accessed through a menu, or system of menus.

By designing menus into the present system, a visual display of alternate system element choices is provided to the user. In addition, typical CAD system command choices (functions such as display, draw or edit) are displayed on the menus. The user may then select a CAD command by entering it from the keyboard or by utilizing an input device such as a digitizer 80 or mouse. Similarly, the user typically selects a building control system symbol or element by utilizing an input device such as a digitizer 80 or a mouse.

A digitizer 80 typically comprises a surface 81 and a pen 82. Movement of pen 82 over surface 81 translates to movement of a position indicator on the display of a display device such as 90. A digitizer 80 facilitates use of prompts such as menus and the creation and modification of drawings.

Optionally, the digitizer may be supplied with an overlay which simultaneously displays the majority of the desired system elements and drawing commands, thus making it significantly easier, particularly for the new user, to choose required system elements and drawing commands without having to search through successive on screen menus. Accordingly, together with other features of the present system, use of an input device such as a digitizer or mouse substantially automates selection of commands and symbols and greatly facilitates the placement and integration of element symbols into a modified drawing related to a specific building control system design.

Figure 15:
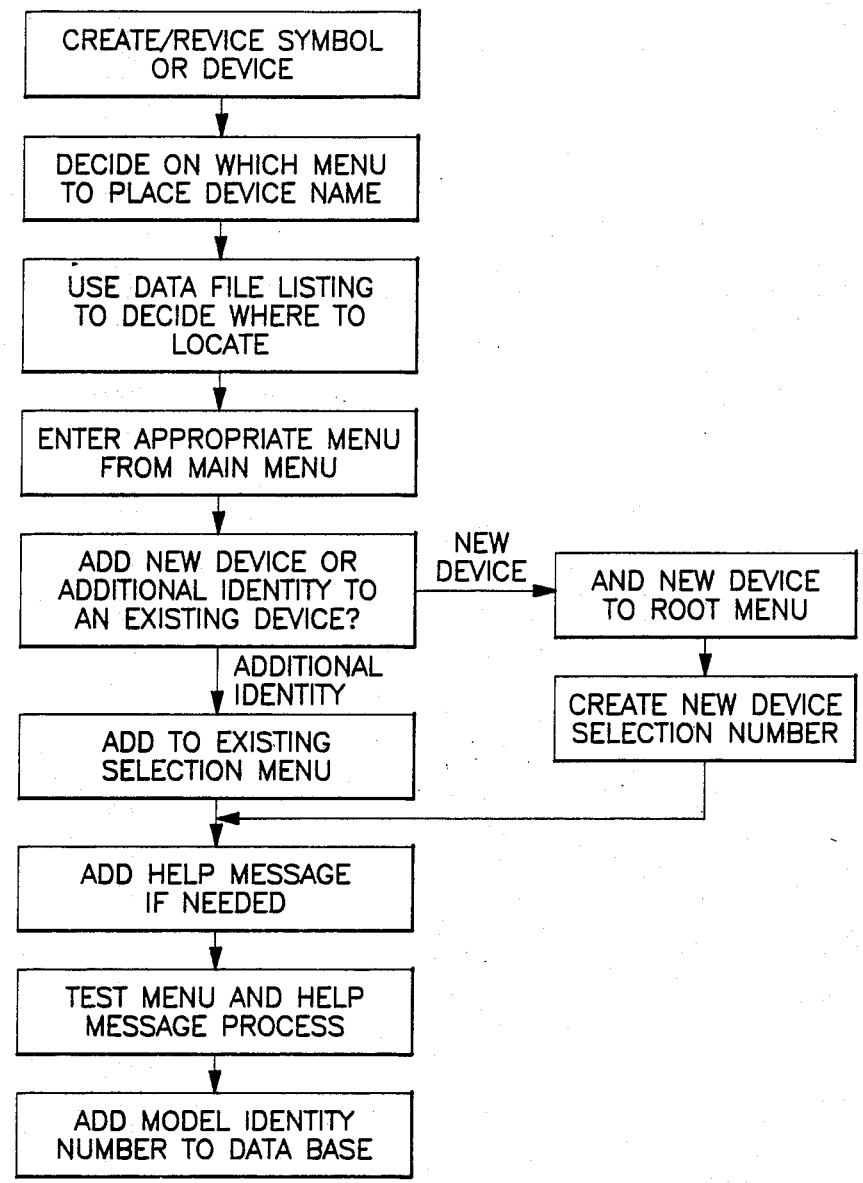
FIG. 15 is a flow chart which shows in block diagram form a procedure for creating or revising a symbol or device in the system according to a scheme of the invention.

FIG. 15 illustrates the process which would typically be used by a designer of the present system to enter and/or update the symbols which represent or comprise the elements in a building control system. The designer may follow the path shown in FIG. 15 to add a completely new device symbol or to add an additional identity to an already existing symbol. This may be accomplished through use of the penetration menus 210 illustrated in FIG. 4 to enter and update symbol choices and through use of the CAD edit menu. The user also uses menu 210 to enter and update the symbol help messages. The help messages, as previously explained, are also typically created and associated with building control system elements for use in the present system.

The ability to extract alpha-numeric information related to graphic symbols or elements stored in the data base or CAD package is dependent upon the assignment of attributes to these elements. Typically the attributes assigned are those for the alpha-numeric or model identifier, quantity required and a construction use code. These attribute assignments are accomplished through block 509 as each symbol or element is stored within the data base or CAD system as a drawing. Typically, the assignment of attributes is carried out at the end of the symbol drawing process. The assignment of attributes normally follows a fixed repetitive sequence for each attribute, such as by using CAD menu commands and prompts. For example, using typical CAD menus and prompts, each new symbol requires the user to assign a tag (attribute identity), a specific symbol prompt phrase, default value, insertion point (typically adjacent to the symbol) and to respond to several further system questions. The sequence must normally be repeated for each attribute assigned to a symbol or element.

A significant advantage of the present system is that each user of the system can gradually customize the graphic and alpha-numeric information stored in the system in order to meet local customer needs. For example, in order to speed up the application of building controls to a specific customer's repetitive needs, new building control installation drawings may be developed. It is then normally appropriate to add to the system menus the specific customer system designations. These might read for example, as follows: XYZ Co., Mixed air control, Single Zone Discharge control, VAV control, etc. The point of adding these customer designations (which means adding new menu choices, prompts, help messages and XYZ systems drawings developed from "generic" standards) is that, when a job is being estimated or engineered for this specific customer, it can be done much faster by using systems that are already customized to the customer's specific needs.

The present system preferably includes the use of a CAD or other system with the ability to relate an alpha-numeric identifier with a drawing related to a building control system element; this is useful to a system user, who can then retrieve a symbol of a system element (or a combination of such symbols) through a menu listing of relevant identifiers.

Figure 4:
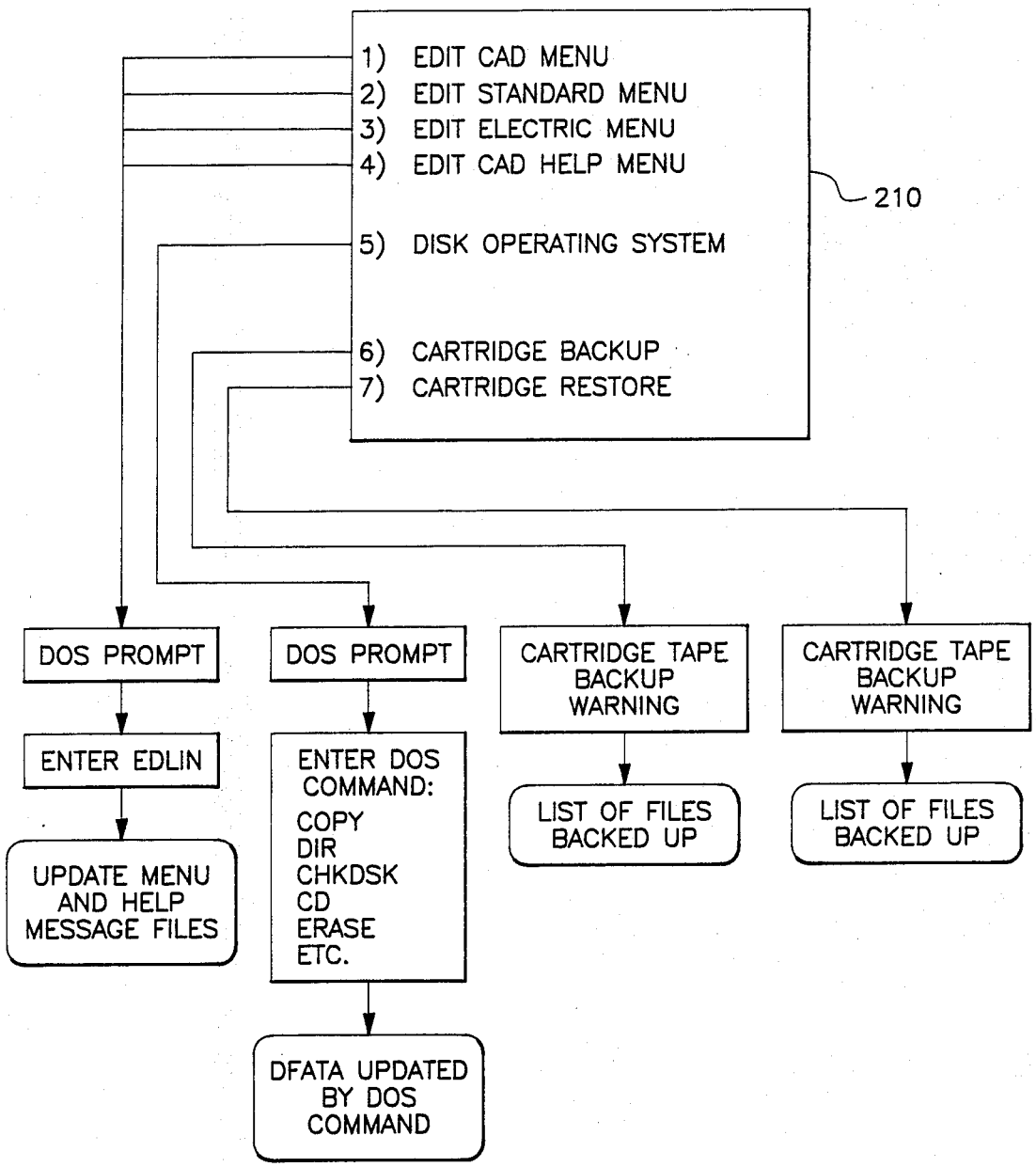
FIG. 4 is a flow chart which shows in block diagram form a typical menu penetration procedure for implementing the backup/restore system data option according to a scheme of the invention.

Accordingly, the designer of a system comprising the present invention typically generates a menu (or a series of menus) displaying appropriate alpha-numeric identifiers representing every system element or other building control system drawing stored in the data base of the present system. From this menu, the user can select a symbol, system element or other system drawing repeatedly when creating a drawing without having to recreate the symbol, system element or other system drawing. As previously indicated, the user can also customize and store for later retrieval any symbol, system element or system drawing by making modifications to such symbols, system element or other system drawing; these modifications are normally made by using display, draw, edit and similar CAD type commands in the system. The user may then modify relevant menus in order to more easily retrieve the modified drawings; such menu modifications may be made, for example, through the EDIT CAD MENU choice of menu 210 (FIG. 4).

In addition to alpha-numeric identifiers, other identifying information can also be associated with graphic symbols in the data base. Such identifying information could, for example, relate to element accessories. Other typical attributes such as device air capacity in cubic feet per minute or power requirements can be stored in the data base and retrieved by model number or by any other alpha-numeric identifier.

Figure 6:
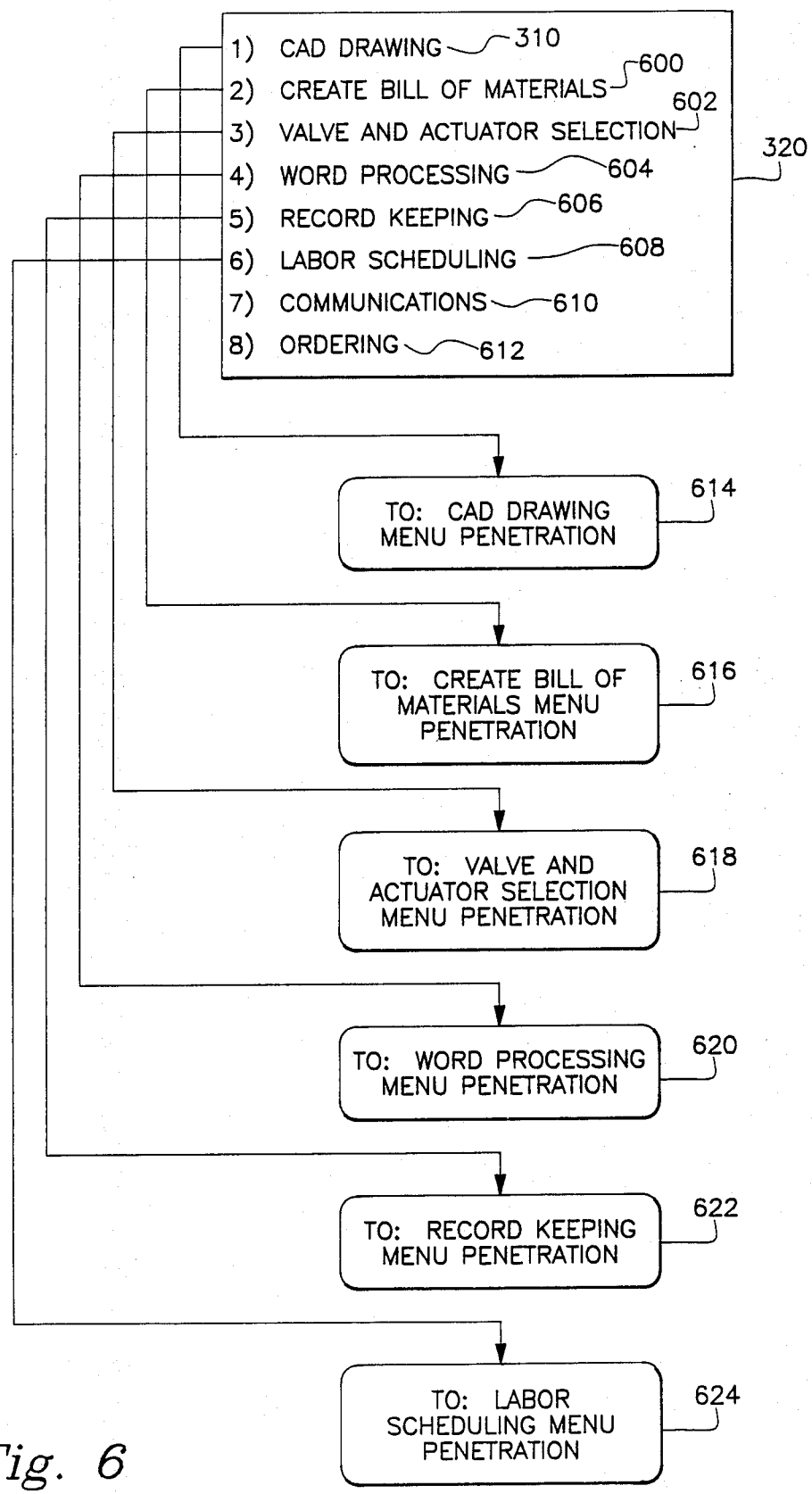
FIG. 6 is a flow chart which shows in block diagram form a typical menu penetration procedure for accessing various other menus provided by the system by the system of the invention.

As previously indicated, the user of the present invention typically accesses the system through a series of menu penetrations; in the preferred embodiment, this was accomplished through a menu software package sold by Magee Enterprises under the trademark "AutoMenu". The menu penetrations could begin as shown in FIG. 6. It is recognized by those skilled in the art that menu penetration systems can be arranged in many different ways to achieve the same end results. For example, a function which is required each time the system is executed could be automatically invoked rather than manually selected by the user. In using the series of menu presentations shown in FIG. 6, however, the user would typically begin by selecting CAD DRAWING choice 310 from menu 320. This choice would result in the display of a typical CAD Main Menu 410 depicted in FIG. 7. The FIG. 7 menu penetration system is a sample menu penetration system which provides the user with the functionality necessary to accomplish the functions of block 509 in FIG. 1, create/update job drawings.

Block 500 in FIG. 1, job takeoff, represents the typical initial step in performing a job estimate or creating a job drawing. When designing a building control system with the present invention, the user typically selects and modifies an initial drawing related to a building control system element by using a device such as a mouse, digitizer or joy stick or by using a keyboard.

When a selection is made, a help message typically appears on a text screen. This help message provides information such as installation information, e.g., how the device is wired or piped, how the device is connected, alpha-numeric identifiers such as model numbers, and ordering information if special ordering is required, etc. Those skilled in the art will recognize that help messages for use in connection with the present invention will vary greatly.

Figure 16:
FIG. 16 is a flow chart which shows in block diagram form an example of a menu and prompt progression that occurs as a user completes a device choice in accordance with a scheme of the invention.

When designing a building control system, the user of the present system is typically provided with a menu list of devices that can be chosen from to meet specific job or customer requirements. FIG. 16 illustrates a typical example of menu and prompt progression that occurs as the user completes a device choice. The first menu shown (identified as Screen 1) is an alpha-numeric listing of initial element identifiers. As soon as the user chooses an initial identifier, e.g., a basic model number such as HP972B, the prompt on Screen 1 changes to "Insertion point:". This coaches the user to position and insert the element in the desired location in the drawing. Based on the example shown in FIG. 16, the menu listing of Screen 2 is then displayed. Screen 2 may be used to list the specific model numbers available for selection, and a second display device 40 (FIG. 2) may be used to provide each specific model's characteristics through help messages. As shown in FIG. 16, the prompt line now reads "Enter identifier number (HP972B1005):". Note the default identity, HP972B1005, which may be chosen by entering a carriage return. The user then chooses, for example, HP972B1005 by either entering a carriage return or "clicking" on the screen menu location with, for example, a mouse or digitizer pen. A Screen 3 menu entitled "Select Quantity" may then be used together with a prompt such as "Enter desired quantity (1):". The default quantity (shown as 1) may be chosen by entering a carriage return, or values up to a predetermined number (e.g., 15) may be chosen with the digitizer or mouse. Quantities different than those listed on a quantity menu such as Screen 3 are normally entered through the keyboard.

In addition, certain devices may require additional menu choices in order to choose additional characteristics that, for example, may specifically affect installation time, e.g., labor hours. For example, certain devices may be either mounted in the field on an equipment room wall or may be specified to be factory mounted in a panel enclosure shipped completely prewired and prepiped. Therefore, a single device may have two or more different installation costs, depending on how and where it is actually installed. Thus, one or more additional menus may be used for such devices to accomodate the need for choosing an additional characteristic, e.g. mounting method.

Quantity data determined through the above process may then be used in the block 511, which represents assembly of the bill of materials.

In the preferred embodiment, block 510, create/update job estimate labor/materials cost, includes three optional functions; these are the creation or updating of an estimating bill of materials; the calculation of installation and engineering labor, hours and dollar value; and calculation of the dollar value of the installation material, including devices comprising the building control system. A job estimating program typically stores descriptor information and then typically transfers this information to a data base program capable of storing or passing this information to other programs such as a spreadsheet program for further processing. Relevant information passed from the job estimating program typically includes, for example, model number, quantity, and relevant installation data such as piping and wiring lengths and installation and engineering hours.

Figure 8:
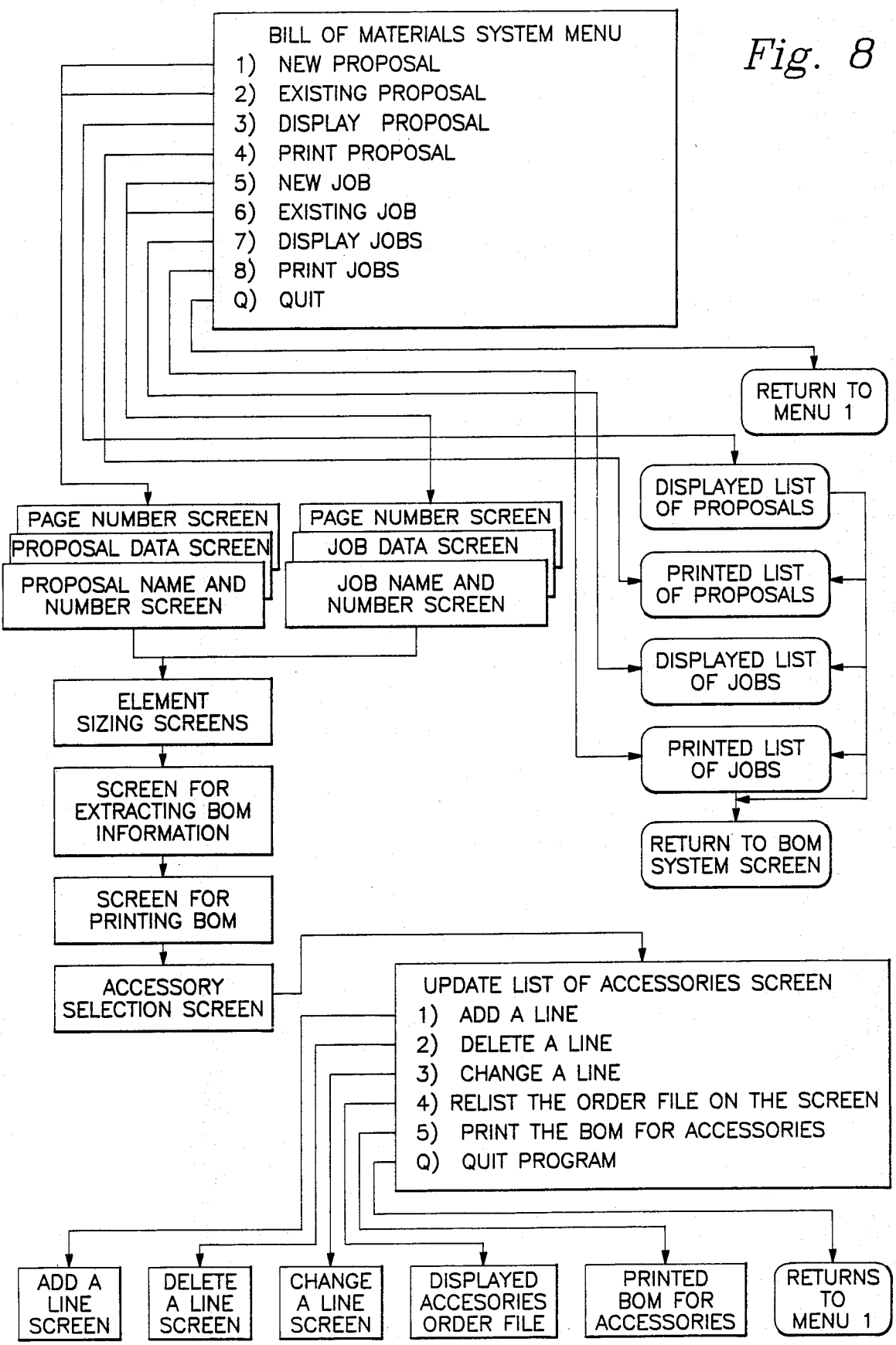
FIG. 8 is a flow chart which shows in block diagram form a typical menu penetration procedure for selecting various options relating to the processing of bill of materials data according to a scheme of the invention.

The bill of materials is typically created by summing the component quantities which constitute a system drawing started in block 509. FIG. 8 demonstrates a typical menu penetration procedure for implementing the creation of a bill of materials. The FIG. 8 menu provides a choice of working on a proposal for a potential customer (the NEW PROPOSAL menu choice) or on a sold job (the NEW JOB menu choice).

As previously indicated with respect to Block 510 as shown in FIG. 1, installation and engineering labor can also be calculated through the present system. Installation labor typically, includes the amount of time required for a workman to install a particular device in a building control system. Engineering labor typically includes the amount of time an application engineer requires to read the specification and to use the present system to lay out an installation diagram, produce job drawings, confirm device selection, and order devices.

Therefore, installation labor and engineering labor may be calculated by locating the applicable device numbers in data base records which contain the amount of installation and engineering labor required for each device. The system preferably prompts the user for variable information which affects the installation labor; examples of such variable information are piping and wire lengths and job site construction difficulty. Such variable information prompts may also include inquiries of whether the building control system supplier will have enough manpower available to perform the building controls installation in the projected time frame, will need to use overtime labor on a job, or, for example, will need to hire a workforce of lower skill level than normal, etc.

In some building control systems, the capacity of certain elements must be determined. Block 505 represents an optional program for sizing or determining the capacity of a building control system, device or other element. Depending upon the particular type of building control system, a sizing program can be designed for any number of elements including, for example, compressors, valves, actuators, power supplies, and batteries.

Compressors are used in pneumatic building control systems; compressed air is distributed in such systems through pneumatic tubing and is manipulated in the system with components such as pneumatic thermostats, controllers, relays, and switches. In designing such pneumatic systems with a system incorporating the present invention, it is typically useful to include in the present system a sizing program for determining the appropriate capacity of the compressor or compressors to be installed in the building control system.

For building control systems which include environmental control systems, e.g., systems which use water or steam for temperature control, it is typically desirable to have a valve sizing program for generating a schedule of valves and/or actuators which will appropriately handle the water or steam in the system.

Such a block 505 sizing program permits the user to automatically determine the size and model of a control valve or actuator required for a specific application. A selection is typically made in block 505 based on specified characteristics such as water flow in gallons per minute, steam flow in pounds per hour, etc. The user can either print a hard copy of the results on a printer (or create a copy on electronic media) and/or transfer the results through block 519 to block 509 for inclusion on the system drawing.

By way of another example, fire alarm systems or other systems requiring electronic components typically require power supply sizing for selecting the appropriate size power supply to be used in connection with the electronic devices in the system; in a fire alarm system, for example, power supplies must typically be sized for providing an uninterruptible power supply for applicable emergency systems such as telephones.

Furthermore, in electronic systems which use power supplies, batteries are typically used for power supply backups, and a sizing program is typically employed for sizing the battery to be used for the backup.

In implementing a block 505 sizing program, an element or device number is typically matched against records in the data base. The quantity of devices, available from the bill of materials, block 511, can then be multiplied by the appropriate capacity factor for each device such as Cubic Feet per Minute (CFM) for a device, wattage requirements for a device, etc., and can then be automatically summed to generate total requirements such as total CFM requirements or total wattage requirements for the entire building control system.

Such an initial process can be used to determine total requirements for devices such as air compressors and power supplies. A great variety of prompts can also be used to initially size an element or device or to further refine the sizing of a building control system component or device. For example, in the case of an air compressor which has been initially sized by calculating total CFM requirements, a series of prompts can be used to further refine the identification or model number of the compressor.

It will be recognized by those skilled in the art that the specific design of such prompts may vary greatly in both format and content, depending upon the individual designer and upon the specific devices for elements being sized. However, for illustrative purposes with respect to an air compressor, one could use an initial prompt such as "Is main line pressure rating 18 pounds per square inch [Y/N]?" If the answer to this question is not yes [Y], a subsequent prompt could request a specific rating (or, for example, a menu listing could list alternative ratings) in order to determine the main line pressure rating. By way of further example, a prompt could inquire "Is altitude above 1000 feet [Y/N]?"

After questions such as these are answered, the user could be further prompted, for example, to choose an oil-less or an oil type model. Such a series of prompts could determine a basic compressor model number.

One could then design into the system the ability to add further identifying characteristics, e.g., to further refine the model number, according to answers of additional questions or prompts. For example, the user could next be prompted to specify the percent run time of the compressor, e.g., 100%, 50% or 33% and, by way of further example, whether the compressor is to be floor or tank mounted. Further identifying requirements could also be requested such as specifying electrical control requirements, e.g., with or without starter, single or three space voltage, and wired or unwired.

In the preferred embodiment of the present system, when the user has answered all of the prompts related to a particular device, he or she is presented with a complete model number for the device, e.g., with a complete air compressor model number and description, and is asked to confirm or correct it, if necessary. The device model number, e.g., the air compressor model number, quantity and description is then normally automatically added to the bill of materials.

Block 505 also provides an option to create a schedule or list for a particular type of component, e.g., to create a valve and actuator schedule or a damper schedule. For example, such an option may be used to automatically help the user select a valve model number and an actuator model number based on typical job requirements such as water flow in gallons per minute, desired pressure drop through the valve, desired valve closeoff rating, etc. Block 506 provides the option to print a hard copy of a particular type of component or several components that have been sized or selected by the system. For example, as previously indicated, a valve and actuator schedule could be printed.

Figure 10A:
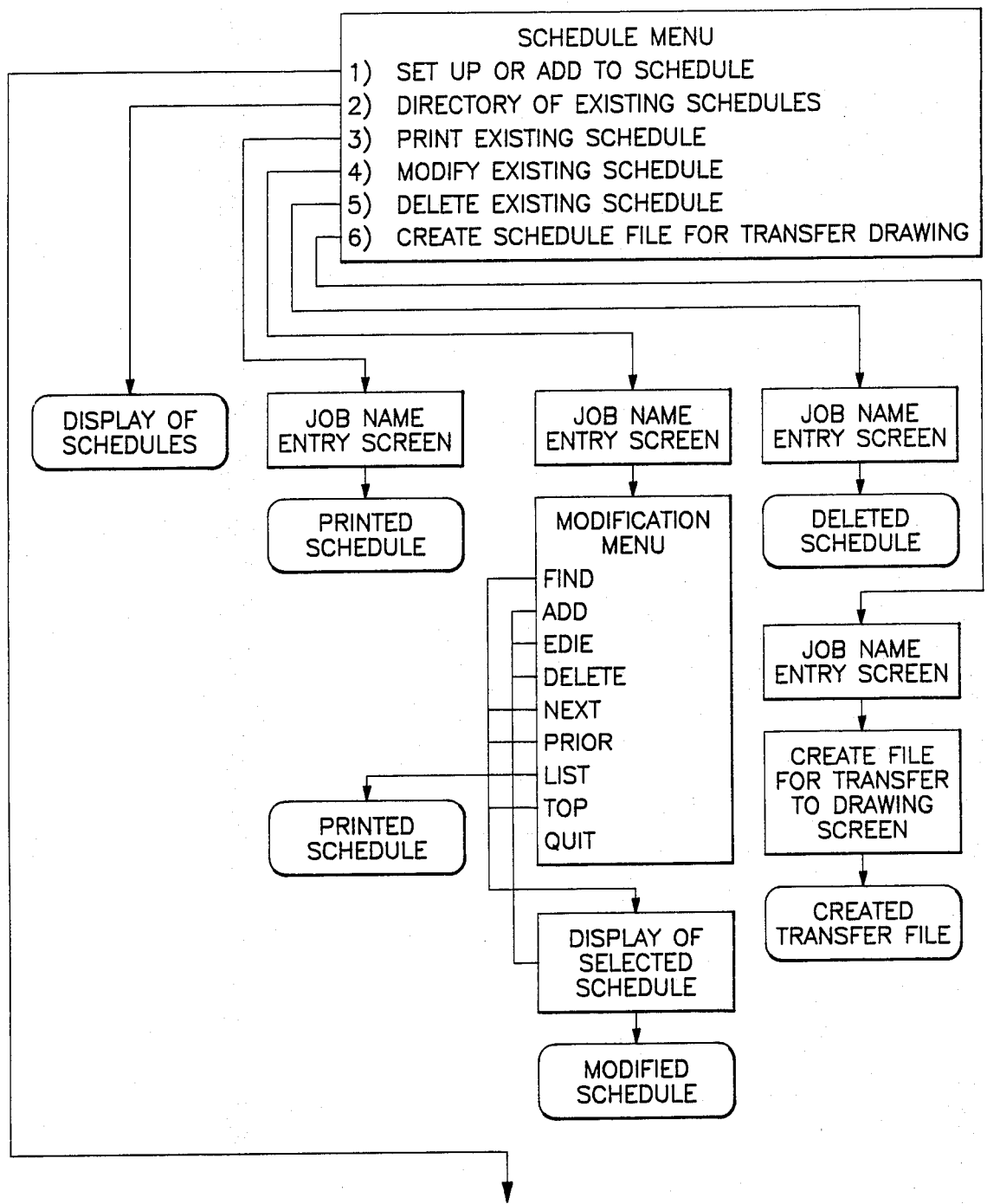
FIG. 10a is a flow chart which shows in block diagram form a typical menu penetration procedure for setting up, adding to, displaying, printing, modifying, deleting or creating schedules according to a scheme of the invention.
Figure 10B:
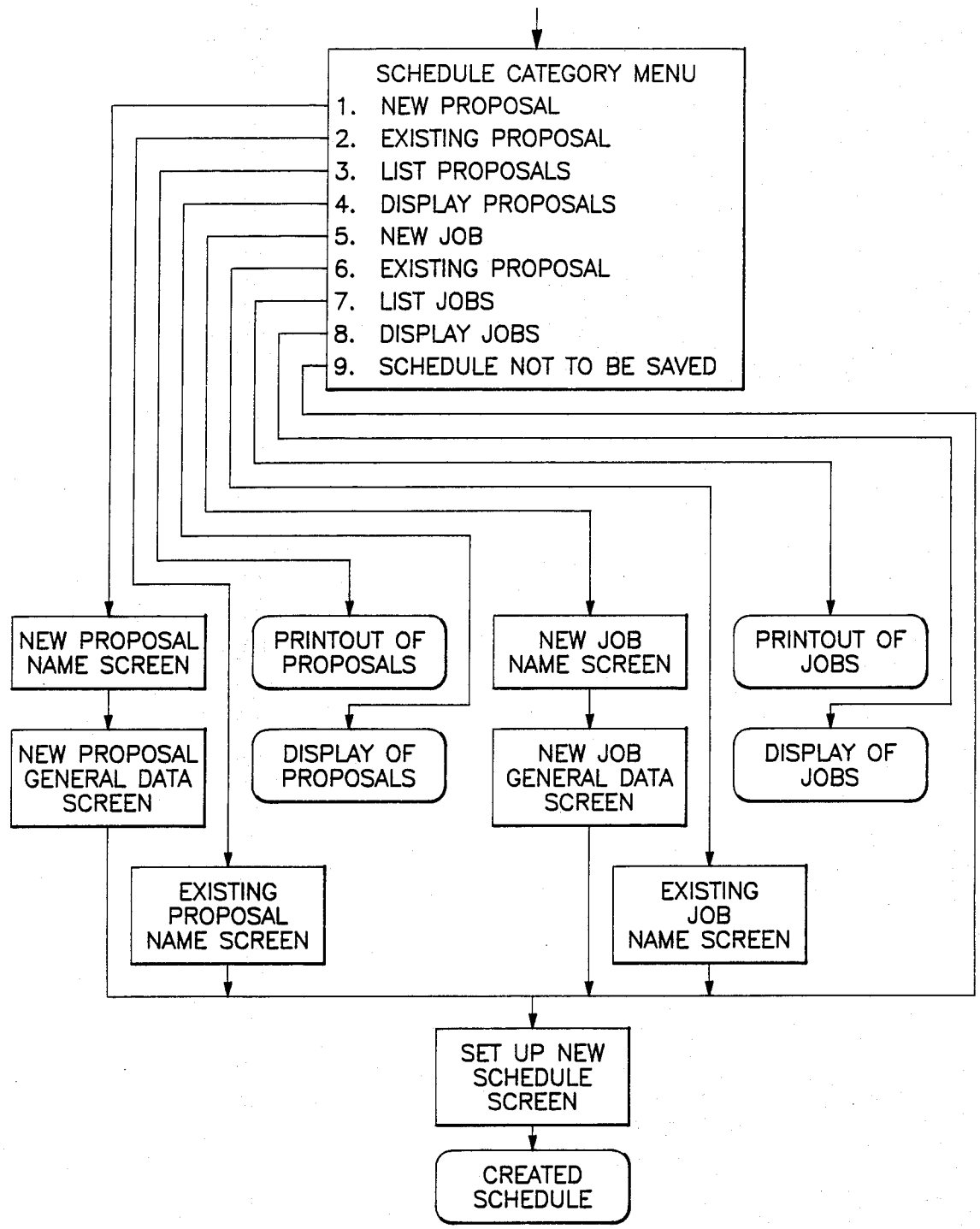
FIG. 10b is a flow chart which shows in block diagram form a typical menu penetration procedure for manipulation of proposal information according to a scheme of the invention.

In this process, which normally begins with a series of prompts, the present system typically queries the user for device specifications, e.g., for valve and actuator job specifications. Typical valve queries include whether the valve is to be used for water or steam operation, whether the valve application requires a two-way or a three-way valve, the required flow rate, the desired pressure drop through the valve, etc. For actuators, typical queries include the desired spring range for the actuator and the desired action for the actuator, e.g., direct or reverse acting. Once the queries are answered, the system automatically displays a listing of applicable devices, e.g., of applicable valves and actuators. Based on the description displayed for each device model number (which is typically displayed on a screen), the user makes a selection. The user can then get a hard copy printout (or a copy on electronic media) of the resulting schedule or list, and/or transfer a copy through block 519 to block 517, job drawing. FIG. 10a–10b demonstrates a typical menu penetration procedure for implementing the selection of applicable valves and actuators.

Block 513 shows an option whereby accessories may be selected and, if desired, an accessory list can be printed, typically either in hard copy for or on electronic media. The system provides the ability to present a prompted series of questions to the user in order to determine what miscellaneous accessories will be required to successfully complete the installation, calibration and start-up of a building control system. The suggested accessories are preferably based upon the specific devices used on the project in question, as opposed to a list of all possible accessories used in general. For example, if a specific thermostat model number TP970A1009 is required, the system then preferably presents a list of specific accessories used with this thermostat asking which ones, if any, are required. The system preferably does this for each device used, then assembles a total accessories list, provides a printed copy if needed for field installation purposes, and then provides a list copy to the job ordering function in block 518.

Once all the materials necessary to implement a particular building control system have been sized and itemized, the cost of the installation materials can then typically be calculated. The cost of the device installation material may be calculated by matching the job drawing device number to the device number in data base records which contain the cost for that device.

In block 518, optional job ordering is employed; this optional feature of the present system is highly advantageous, since it greatly reduces labor costs normally associated with manually generating purchase orders from raw information as well as virtually eliminating the error-prone manual transfer of data in a manual ordering process. Here, devices are typically grouped by supplier for ordering from the appropriate supplier. Such suppliers could typically include the user's distribution centers, the user's factories, or outside suppliers.

In ordering devices, using the present system, a screen typically displays an ordering format and prompts the user to group the ordered equipment by quantity and shipment location, e.g., site and floor. If the devices are stocked by the user, the order can be automatically transmitted to the appropriate user sourcing location. If it is not a user-stocked device, the system can be configured to generate an appropriate purchase order, e.g., by modem or hard copy.

Block 511 shows an example of an option for assembling a bill of materials or BOM (a bill of materials is sometimes referred to in the present application, particularly in the Figures, as a BOM). The assembly of the bill of materials typically starts by extracting the pertinent data such as alpha-numeric identifiers and quantities from the job drawing.

The bill of materials typically includes all the devices displayed on a building control system drawing, as well as those devices whose model numbers were generated by an element sizing program in block 505. Within job estimating, block 510, a generalized data base program typically collects quantity data for the bill of materials information from the devices listed on the drawing initiated in block 500, job takeoff.

After the bill of materials has been assembled, the user has the option, in block 512, of printing a hard copy (or creating a copy on electronic media) of the bill of materials and/or of exporting the bill of materials through block 519, for inclusion on the block 509 job drawing. Information from the bill of materials can also be passed to the job ordering program. FIG. 8 demonstrates a typical menu penetration procedure for implementing the creation of a bill of materials.

Figure 9:
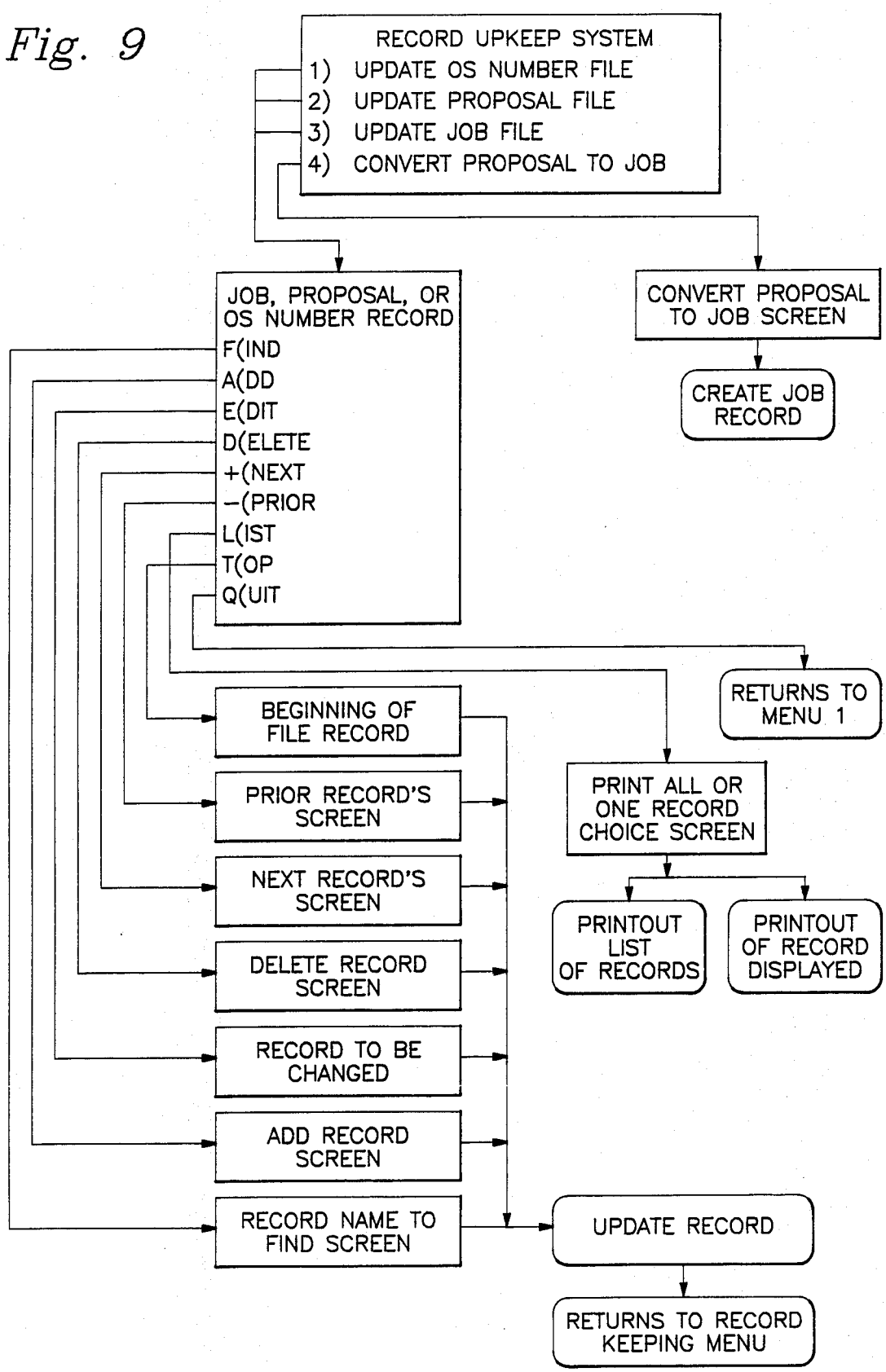
FIG. 9 is a flow chart which shows in block diagram form a typical menu penetration procedure for implementing the record upkeeping system of the invention.

Block 507 optionally creates or updates job proposal records and/or sold job records. Within Block 507, a generalized data base program typically extracts job or proposal information from the system data base. Information can also be obtained by the system prompting the user for information regarding the specific job or proposal. Such records typically include job related information such as customer or contractor name, customer address, bid price, contract price, ordering information such as the dates the components were ordered, the architect name, the engineer's name assigned to the project, the proposal number and/or job numbers, etc. Other information tabulated for bookkeeping purposes includes the number of labor hours, and what equipment has been shipped or returned. Drawing information typically includes a drawing name. FIG. 9 demonstrates a typical menu penetration procedure for the block 507 record keeping system for job proposal records and sold job records.

Figure 11:
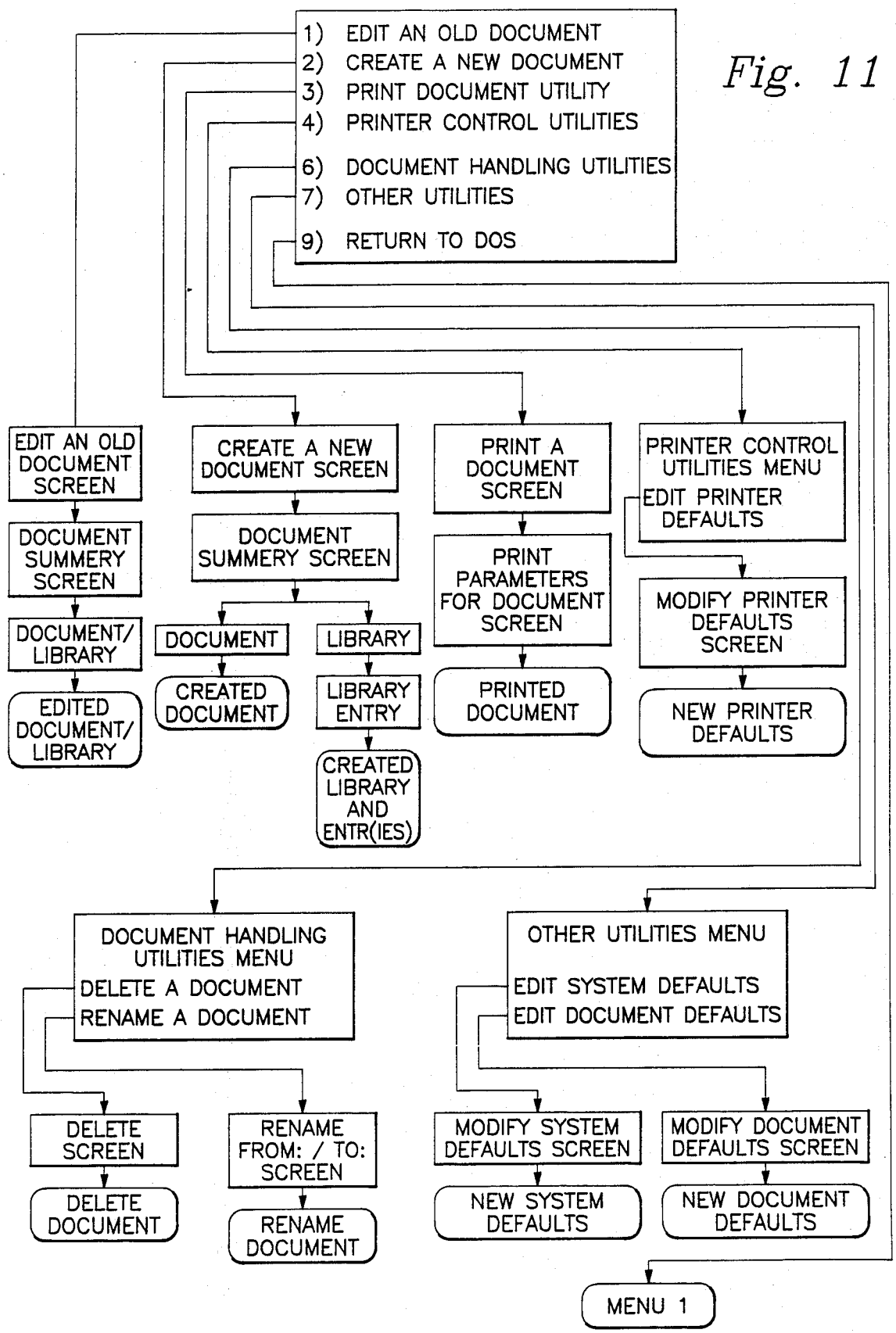
FIG. 11 is a flow chart which shows in block diagram form a typical menu penetration procedure for processing documents according to a scheme of the invention.

Block 502 represents an optional generalized word processing package. The package can be used in typical secretarial functions such as customer or interoffice correspondence whose output is hard copy or electronic media copy or electronic mail. It can also be used to compose, modify or print (on hard copy or electronic media) form letters as shown in block 503; the letter may be for many purposes such as job proposals, billing, and sales reporting. FIG. 11 demonstrates a typical menu penetration procedure for implementing such a word processing package.

Normally, job drawings include a control sequence of operation. A sequence of operation is a written description of how a building control system will operate. A building owner may refer to it when operating and maintaining a building system. Block 502, word processing, also provides the ability to modify standard sequences of operation, create new ones, store them, and add them to the applicable drawings Accordingly, block 519 optionally transfers the sequences of operation to the job drawing program in block 509 for inclusion on the job drawing.

Figure 12A:
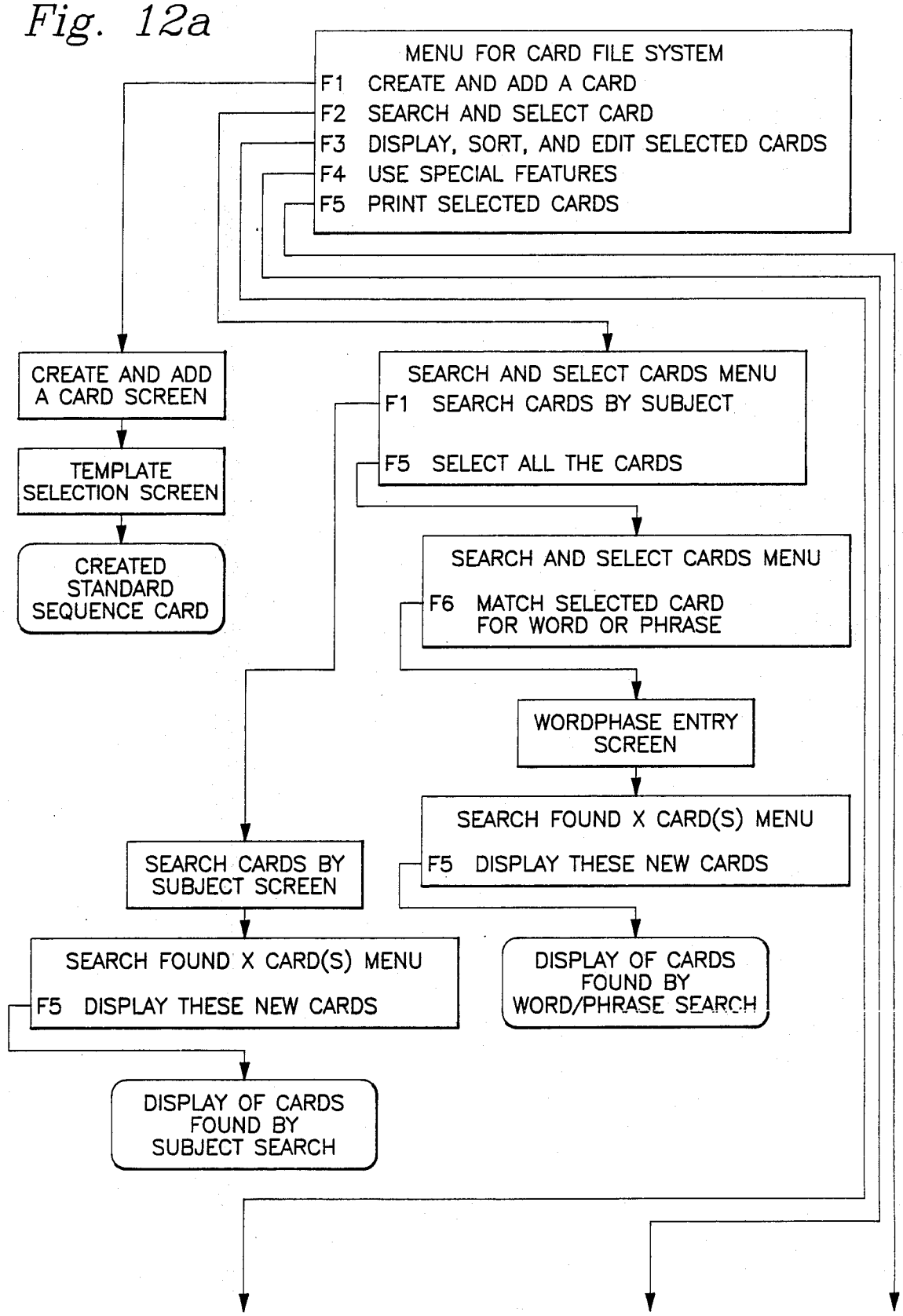
FIGS. 12a and 12b are to be considered together to represent a flow chart which shows in block diagram form a typical menu penetration procedure for document searching according to a scheme of the invention.
Figure 12B:
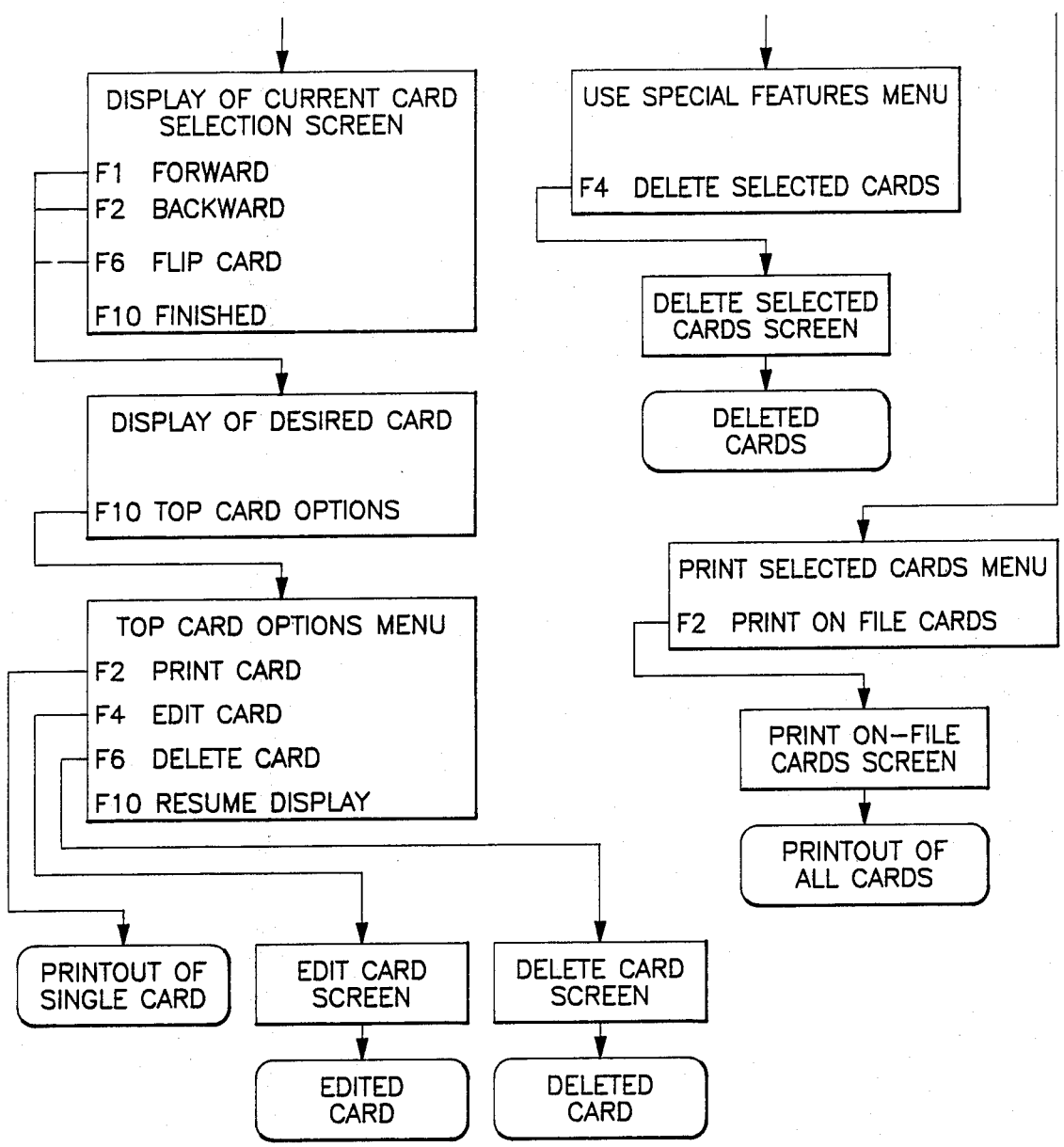

In addition, block 504 may also provide an option to search through all sequences of operation using a key phrase, word, or title, in order to locate a desired sequence of operation. For example, using an "electronic" card file system (such as Ashton-Tate's product sold under the trademark "On-File") wherein a card or similar record is established for each sequence of operation, a user of the present system may start a search for all "reset" sequences of operation. Utilizing the information presented, the user may then choose the most appropriate sequence. Block 504 may similarly be used for storing and searching other subjects, e.g. customer-related information. FIG. 12a-12b demonstrates a typical menu penetration procedure for implementing this type of document searching.

Figure 13:
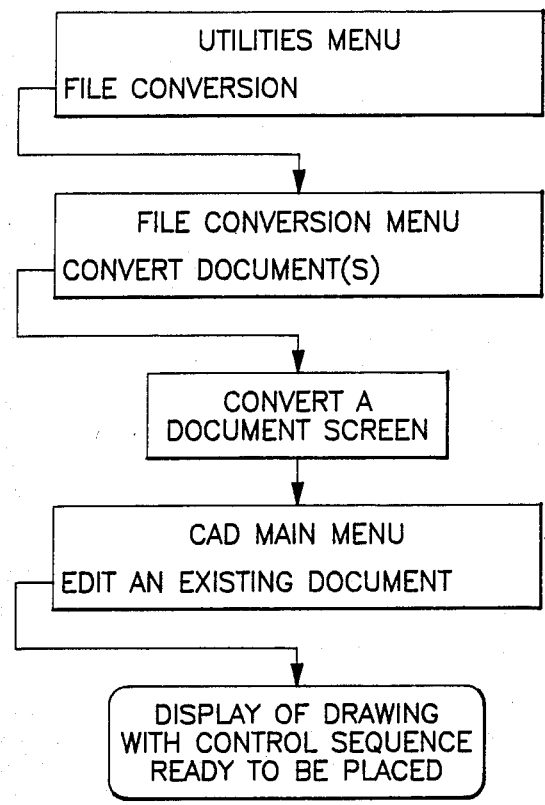
FIG. 13 is a flow chart which shows in block diagram form a typical menu penetration procedure for displaying drawings with control sequence ready to be placed according to a scheme of the invention.

Block 504 provides the user with the option of printing a hard copy of stored information, e.g., a sequence of operation (or of creating a copy on electronic media) or of transferring stored information, e.g., a sequence of operation to the job drawing (through block 519) for display in block 509. FIG. 13 demonstrates a typical menu penetration procedure for transferring information to the job specification drawing.

Block 515 provides an option for scheduling labor. Utilizing a generalized spreadsheet package, the program is typically implemented as follows. In the preferred embodiment, using an automated spreadsheet matrix, building control system jobs are listed as row titles and the work weeks are listed as column titles; the user inputs the number of hours that must be expended on each job for each week of the schedule, and a preprogrammed algorithm then totals a series of weekly columns and divides by the number of work hours in each week to yield the total number of persons which must be available each week. The results of the labor scheduling program can be transferred to a central location of the building control system supplier for coordination or other purposes.

Figure 14:
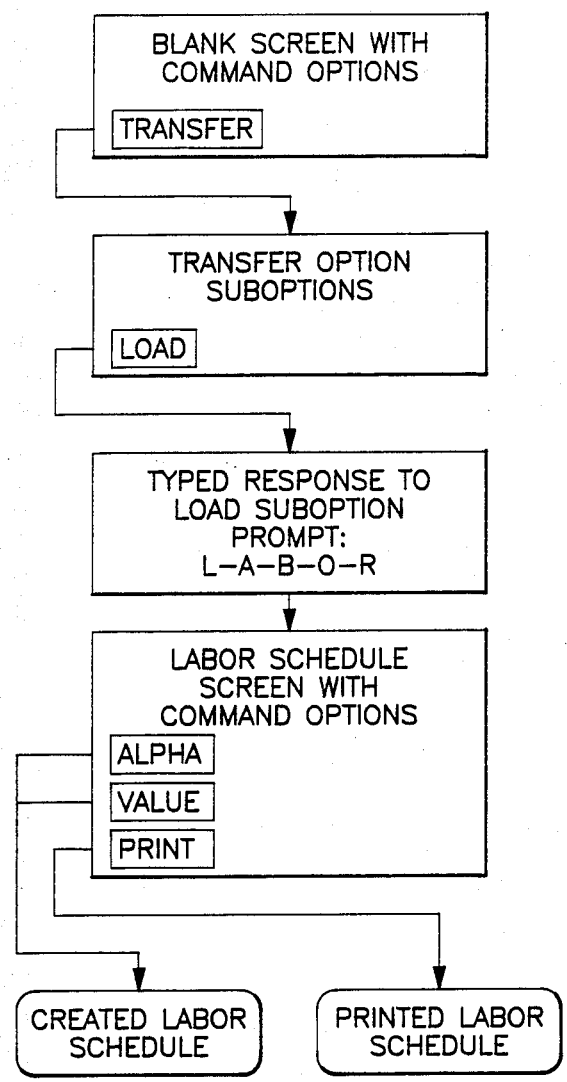
FIG. 14 is a flow chart which shows in block diagram form a typical menu penetration procedure for implementing a labor schedule according to a scheme of the invention.

Block 516 provides an option for printing the labor schedule created in block 515. This can be in hard copy form or on electronic media. FIG. 14 demonstrates a typical menu penetration procedure for implementing a labor schedule.

In block 517, the user has the option of printing (on hard copy or on electronic media) job drawings, which are drawings including information such as the building control system, sequences of operation, valve schedules, or a bill of materials. This will typically be done after the completion of a building control system design. FIG. 5 demonstrates a menu penetration procedure for moving the bill of materials and valve schedule to the drawing for subsequent printing.

The user also has the option in block 521 to backup the system for data security purposes. This would typically be done on a periodic basis or, for example, after the completion of a large building control system design. The system could then be restored in the event of data destruction. Menu 210 in FIG. 4 demonstrates a menu penetration system for the backup and restore feature which was implemented in the preferred embodiment with a cartridge tape backup system, specifically with a Colorado Memory Systems, Inc. product sold under the trademark "QIC-60 Tape Backup System".

Block 520 illustrates a remote communications capability, typically implemented with a generalized communications package (such as he DTSS Incorporated product sold under the trademark "DaTapaSS"); the implementation also normally includes use of a modem 50 and, for example, system user hard wiring or public communication systems. Such a capability enables remote locations to send and receive any information contained within the present system to and from each other as well as to and from a central location. Remote communication is an extremely useful capability and provides many advantages, for example, the capability to remotely supervise work quality, provide technical assistance and assist in workload leveling and sharing.

The preferred embodiment of the present system includes automated transfer of alpha-numeric information between a portion of the software packages that were used to create the system. These transfers occur from a word processing package to a CAD package, from a data base package to the CAD package and from the CAD package to the data base package. In the preferred embodiment, this involved implementing automated transfer from Ashton-Tate's word processing product sold under the trademark "Multimate Advantage" to the Autodesk Inc. CAD package sold under the trademark "AutoCAD"; transfer from AutoCAD to the Ashton-Tate's data base package sold under the trademark "dBase III+"; and transfer from AutoCAD to dBase III+.

It will be recognized by those skilled in the art that transfer of information between such software application programs requires determination of the file formats or protocols acceptable to the sending and receiving of program information, the development of batch files which are automatically executed by the DOS, and the development of script files which are automatically executed inside the application programs. The batch and script files are thus customized to the program information transfer requirements, file names and DOS directory designations.

The process described below includes the creation of a batch file and a script file designed to automatically execute a series of commands in order to automate an information transfer from Multimate Advantage to AutoCAD. In the preferred embodiment, this included the use of a conversion package, specifically the Technical Software, Inc. product sold under the trademark "AutoWord." This automatic transfer was then implemented through the menu of FIG. 5 by selecting "CONVERT WP DOCUMENT TO CAD DRAWING".

The batch file is written so that it initially executes the Multimate Advantage Utilities package. After that execution, the batch file is suspended and the user is required to respond to prompts indicating the specific alpha-numeric text (e.g., the sequence of operation) to convert to a text format, i.e. to convert from the Multimate Advantage format file to an ASCII format file (FILE1.TXT). The user then exits from the Multimate Advantage Utilities package.

The batch file is written so that, upon exiting the Multimate Advantage Utilities package, the batch file resumes by executing AutoWord to convert the text file (FILE1.TXT) to the AutoCAD DXF format (FILE1.DXF).

The batch file may be written so that it next erases the existing text drawing file (FILE1.DWG) from the AutoCAD directory.

The batch file then preferably executes AutoCAD, and passes parameters consisting of a default drawing name (FILE1.DWG) and a script file (FILE1.SCR).

The script file (FILE1.SCR) may be written and placed in the AutoCAD directory so that it automatically inserts the alpha-numeric information (e.g., the sequence of operations FILE1.DXF) information on the new drawing file (FILE1.DWG) using AutoCAD's DFXIN command.

The script file (FILE1.SCR) then preferably is written to prompt for the drawing name into which the newly created drawing file (FILE1.DWG) is to be inserted. At this point, the script file is typically written to complete execution and, after execution, control is returned to the user. The user then enters the correct job drawing file name and a carriage return.

Having completed execution of the batch and script files, the user then normally inserts the desired alphanumeric information (e.g., the sequence of operation, drawing file FILE1.DWG) on the drawing selected. The user then saves the job drawing file and exits from AutoCAD, bringing him back to the main AutoCAD menu.

It will be recognized by those skilled in the art that a similar batch file and script file can be written to automate the transfer between dBase III+ and AutoCAD and, similarly, from AutoCAD to dBase III+. It will also be recognized by those skilled in the art that many alternate implementations are possible.

Figure 7:
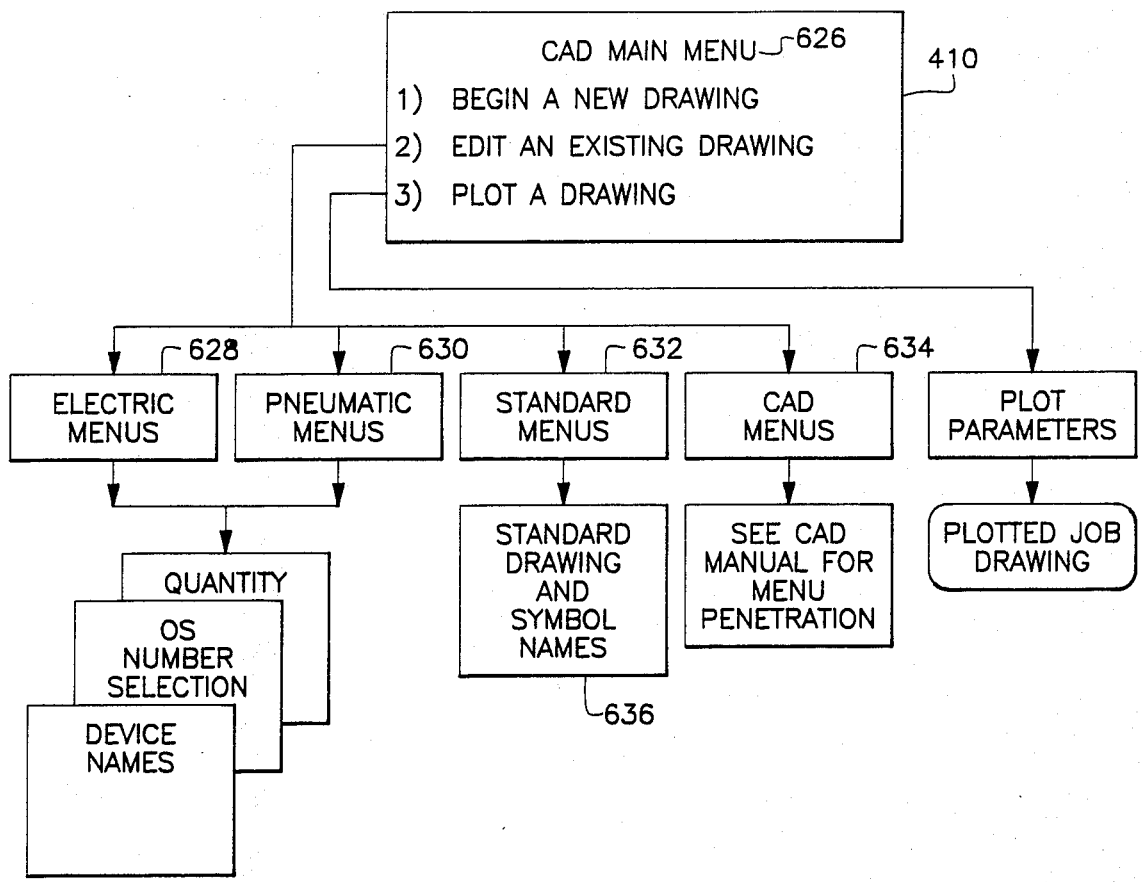
FIG. 7 is a flow chart which shows in block diagram form a typical menu penetration procedure for selecting various CAD options as provided by the invention.

Having described in detail various functions and capabilities of the invention, the operation of the invention will now be explained further by way of expanding upon an example briefly described above. Referring again to FIG. 6, as noted above, the user of the present invention typically accesses the system through a serious of menu penetrations. These are shown in FIG. 6 as menu 320 having choices 310, 600, 602, 604, 606, 608, 610 and 612. These choices result in the routing of the system processing to various other menus via blocks 614, 616, 618, 620, 622, and 624. In using the series of menu presentations shown in FIG. 6, the user would typically begin by selecting CAD DRAWING choice 310 from menu 320. This choice would route the system via block 614 and result in the display of a typical CAD main menu 410 depicted in FIG. 7. As noted above, the FIG. 7 menu penetration system is a sample penetration system which provides the user with the functionality necessary to accomplish the functions of block 509 in FIG. 1, create/update job drawings. Further expanding upon this example, the user might then select from the CAD main menu 410 on FIG. 7 choice 626 to begin a new drawing. Having selected choice 626, the user is then presented with electric menu 628, pneumatic menu 630, standard menus 632 and CAD menus 634. The user would select the appropriate menu from these choices depending upon his needs for the particular job. If the user chooses, for example, standard menus 632 he would pull up the standard drawing and symbol names as represented by block 636. The user could then begin a new drawing using the standard drawings and symbol means. In a like manner, the use could choose other options from the CAD main menu as shown in FIG. 7 in order to, for example, plot a job drawing using plot parameters or add an existing drawing. All of the menu-driven displays would operate in a like manner with the exception that menu options differ for different operations.

The present invention is to be limited only in accordance with the appended claims, since persons skilled in the art may devise other embodiments still within the limits of the claims.

The embodiments of an invention in which an exclusive property or right is claimed are defined as follows:

1. A computer system for substantially automating the design of a building control system, comprising:
    (a) processor means for processing data stored in a data base wherein the data is related to a building control system design and comprises both graphic and alphanumeric information, including building control device symbols and textual descriptions of the building control system requirements and information related to labor and material costs;
    (b) display means comprising a first display for displaying textual portions of the data and a second display for performing graphic drawing with associated commands;
    (c) the processor means comprising means for calling up on the display an initial drawing related to a building control system element, the initial drawing comprising graphic and related alpha-numeric information including an identifier associated with the element and a prompt guiding modification of the initial drawing; and
    (d) the processor means further comprising means for creating a modified drawing by incorporating changes into the initial drawing and means for estimating costs related to the building control system design wherein the modified drawing is related to a building control system design.

2. The system of claim 1 wherein the processor means further comprises means for communicating between separate physical locations information related to the building control system design.

3. The system of claim 1 wherein the building control system is selected from the group consisting essentially of a pneumatic building control system, an electronic building control system, an environmental building control system, an energy management building control system, an automation building control system, a fire and security building control system and combinations thereof.

4. The system of claim 1 wherein the information in the prompt comprises specific customer-related information.

5. The system of claim 1 wherein the initial drawing related to a building control system element comprises a standard building control system element.

6. The system of claim 1 wherein the initial drawing related to a building control system element comprises a customized building control system element.

7. The system of claim 1 wherein an alpha-numeric identifier is located substantially adjacent to the element in the drawing.

8. The system of claim 1 wherein the processor means further comprises means for backing up the information in the system so that the system can be restored in the event of information destruction.

9. The system of claim 1 wherein the means for calling up comprises a menu providing a list of alphanumeric identifier choice related to the initial drawing to be called up on the display.

10. The system of claim 1 wherein the processor means further comprises means for ordering devices for use in installing a building control system at a customer location.

11. The system of claim 10 wherein the processor means further comprises means for communicating between separate physical locations information related to the building control system design.

12. The system of claim 1 wherein the processor means further comprises means for generating a standard sequence of operation related to the building control system design.

13. The system of claim 12 wherein the processor means further comprises means for incorporating the sequence of operations into the modified drawing.

14. The system of claim 1 wherein:
the prompt comprises help messages which fill a substantial portion of a display;
the display means comprises first and second display devices; and
the help messages are displayed on the first display device and the drawing related to a building control system element is displayed on the second display device.

15. The system of claim 14 wherein the processor means further comprises means for modifying the help messages so that modified help messages can be stored in the data base for later recall and use.

16. The system of claim 1 wherein the processor means further comprises form letter means for generating letters, the form letter means comprising a series of form letters related to matters which arise in installing a building control system.

17. The system of claim 16 wherein the processor means further comprises means for communicating between separate physical locations information related to the building control system design.

18. The system of claim 1 wherein the processor means further comprises means for generating a proposal to a customer, wherein the proposal is related to the building control system design.

19. The system of claim 18 wherein the processor means further comprises means for communicating between separate physical locations information related to the building control system design.

20. The system of claim 1 wherein the processor means further comprises means for tabulating information related to installing a building control system.

21. The system of claim 20 wherein the processor means further comprises means for communicating between separate physical locations information related to the building control system design.

22. The system of claim 1 wherein the processor means further comprises means for tabulating information related to installing a plurality for building control systems at a plurality of customer locations.

23. The system of claim 22 wherein the processor means further comprises means for communicating between separate physical locations information related to the building control system design.

24. The system of claim 1 wherein the processor means comprises word processor means for generating alpha-numeric information related to a building control system design.

25. The system of claim 24 wherein the processor means further comprises means for communicating between separate physical locations information related to the building control system design.

26. The system of claim 1 wherein the processor means comprises means for ordering devices within the building control system design for use in installing the building control system at a customer location.

27. The system of claim 26 wherein the processor means further comprises means for communicating between separate physical locations information related to the building control system design.

28. The system of claim 1 wherein the processor means further comprises means for sizing the capacity of a device related to the element.

29. The system of claim 28 wherein the processor means further comprises means for generating a list of devices related to the element, the list comprising an identifier of each device, the quantity of each device, a description of each device and the capacity of each device, and a designated location for the installation of each device.

30. The system of claim 1 wherein the processor means comprises digitizer means comprising a surface and a pen, movement of the pen over the surface translating to movement of a position indicator on the display, the digitizer means facilitating use of the prompt and the means for creating a modified drawing.

31. The system of claim 30 wherein the digitizer means comprises an overlay covering the surface, the overlay comprising a menu listing of alpha-numeric identifier and editing choices related to the building control system element for facilitating use of the means for calling up and the means for creating.

32. The system of claim 1 wherein the processor means further comprises means for identifying and selecting accessories related to the building control system design.

33. The system of claim 32 wherein the processor means further comprises means for ordering devices for use in installing a building control system at a customer location.

34. The system of claim 33 wherein the processor means further comprises means for communicating between separate physical locations information related to the building control system design.

35. The system of claim 1 wherein the prompt related to the element comprises a first menu comprising a list of alpha-numeric identifier choices related to the element and a second menu comprising a list of quantity choices related to the element.

36. The system of claim 35 wherein the means for creating a modified drawing comprises means for adding an additional element to the initial drawing by selecting the additional element from the first menu list.

37. The system of claim 35 wherein the means for creating a modified drawing comprises means for replacing a first element in the drawing with a second element listed in the first menu.

38. The system of claim 35 wherein the means for creating a modified drawing comprises means for deleting an element from the initial drawing by using the first menu.

39. The system of claim 1 wherein:
the alpha-numeric information stored in the data base further comprises quantity data; and
the processor means further comprises means for creating a bill of materials for inclusion in the modified drawing, the bill of materials comprising a list of devices related to the element, an identifier of each device, the quantity of each device, and a description characteristic of each device.

40. The system of claim 39 wherein the processor means further comprises means for generating job labor scheduling information related to installing a building control system at a customer location.

41. The system of claim 40 wherein the processor means further comprises means for communicating between separate physical locations information related to the building control system design.

42. The system of claim 39 wherein the processor means further comprises means for billing the customer for a payment related to the building control system.

43. The system of claim 42 wherein the processor means further comprises means for communicating between separate physical locations information related to the building control system design.

44. The system of claim 39 wherein the processor means further comprises means for ordering devices for use in installing a building control system at a customer location.

45. The system of claim 44 wherein the processor means further comprises means for communicating between separate physical locations information related to the building control system design.

46. The system of claim 39 wherein the processor means further comprises means for ordering devices for use in installing a building control system at a customer location.

47. The system of claim 46 wherein the processor means further comprises means for communicating between separate physical locations information related to the building control system design.

48. The system of claim 39 wherein the prompt related to the element comprises a first menu comprising a list of alpha-numeric identifier choices related to the element and a second menu comprising a list of quantity choices related to the element.

49. The system of claim 48 wherein the means for creating a modified drawing comprises means for adding an additional element to the initial drawing by selecting the additional element from the first menu list.

50. The system of claim 48 wherein the means for creating a modified drawing comprises means for replacing a first element in the drawing with a second element listed in the first menu.

51. The system of claim 48 wherein the means for creating a modified drawing comprises means for deleting an element from the initial drawing by using the first menu.

52. The system of claim 1 wherein:
the processor means further comprises means for compiling a job file of information including the modified drawing and selected supplemental alpha-numeric information from the data base, the job file describing a building control system design meeting specific customer requirements.

53. The system of claim 52 wherein:
the alpha-numeric information stored in the data base comprises quantity data; and
the processor means further comprises means for creating a bill of materials for inclusion in the job file, the bill of materials comprising a list of devices related to the element, an identifier of each device, the quantity of each device, and a descriptive characteristic of each device.

54. The system of claim 53 wherein the processor means further comprises means for communicating between separate physical locations information related to the building control system design.

55. The system of claim 53 wherein the processor means further comprises means for ordering devices for use in installing a building control system at a customer location.

56. The system of claim 55 wherein the processor means further comprises means for communicating between separate physical locations information related to the building control system design.

57. The system of claim 53 wherein the processor means further comprises means for generating a job labor scheduling information related to installing a building control system at a customer location.

58. The system of claim 57 wherein the processor means further comprises means for communicating between separate physical locations information related to the building control system design.

59. The system of claim 53 wherein the processor means further comprises means for billing the customer for a payment related to the building control system.

60. The system of claim 59 wherein the processor means further comprises means for communicating between separate physical locations information related to the building control system design.

61. The system of claim 53 wherein the processor means further comprises means for identifying and selecting accessories related to the building control system design.

62. The system of claim 61 wherein the processor means further comprises means for ordering devices for use in installing a building control system at a customer location.

63. The system of claim 62 wherein the processor means further comprises means for communicating between separate physical locations information related to the building control system design.

64. The system of claim 53 wherein the prompt related to the element comprises a first menu comprising a list of alpha-numeric identifier choices related to the element and a second menu comprising a list of quantity choices related to the element.

65. The system of claim 64 wherein the means for creating a modified drawing comprises means for adding an additional element to the initial drawing by selecting the additional element from the first menu list.

66. The system of claim 64 wherein the means for creating a modified drawing comprises means for replacing a first element in the initial drawing with a second element listed in the first menu.

67. The system of claim 64 wherein the means for creating a modified drawing comprises means for deleting an element from the initial drawing by using the first menu.

68. The system of claim 51 wherein the processor means further comprises means for communicating between separate physical locations information related to the building control system design.

69. The system of claim 52 wherein the means for calling up comprises a menu providing a list of alpha-numeric identifier choice related to the initial drawing to be called up on the display.

70. The system of claim 52 wherein the initial drawing related to a building control system element comprises a standard building control system element.

71. The system of claim 52 wherein the initial drawing related to a building control system element comprises a customized building control system element.

72. The system of claim 52 wherein the building control system is selected from the group consisting essentially of a pneumatic building control system, an electronic building control system, an environmental building control system, an energy management building control system, an automation building control system, a fire and security building control system and combinations thereof.

73. The system of claim 52 wherein the information in the prompt comprises specific customer-related information.

74. The system of claim 52 wherein the processor means further comprises means for backing up the information in the system so that the system can be restored in the event of information destruction.

75. The system of claim 52 wherein the processor means further comprises means for sizing the capacity of a device related to the element.

76. The system of claim 75 wherein the processor means further comprises means for generating a list of devices related to the element, the list comprising an identifier of each device, the quantity of each device, a description of each device and the capacity of each device, and a designated location for the installation of each device.

77. The system of claim 52 wherein the processor means further comprises means for ordering devices for use in installing a building control system at a customer location.

78. The system of claim 77 wherein the processor means further comprises means for communicating between separate physical locations information related to the building control system design.

79. The system of claim 52 wherein the processor means further comprises means for sizing the capacity of a device related to the element.

80. The system of claim 79 wherein the processor means further comprises means for generating a list of devices related to the element, the list comprising an identifier of each device, the quantity of each device, a description of each device and the capacity of each device, and a designated location for the installation of each device.

81. The system of claim 52 wherein the processor means further comprises means for generating a standard sequence of operation related to the building control system design.

82. The system of claim 81 wherein the processor means further comprises means for incorporating the sequence of operations into the modified drawing.

83. The system of claim 52 wherein:
the prompt comprises help messages which fill a substantial portion of a display;
the display means comprises first and second display devices; and
the help messages are displayed on the first display device and the drawing related to a building control system element is displayed on the second display device.

84. The system of claim 83 wherein the processor means further comprises means for modifying the help messages so that modified help messages can be stored in the data base for later recall and use.

85. The system of claim 52 wherein the processor means further comprises form letter means for generating letters, the form letter means comprising a series of form letters related to matters which arise in installing a building control system.

86. The system of claim 85 wherein the processor means further comprises means for communicating between separate physical locations information related to the building control system design.

87. The system of claim 52 wherein the processor means further comprises means for tabulating information related to installing a building control system.

88. The system of claim 87 wherein the processor means further comprises means for communicating between separate physical locations information related to the building control system design.

89. The system of claim 52 wherein the processor means further comprises means for tabulating information related to installing a plurality of building control systems at a plurality of customer locations.

90. The system of claim 89 wherein the processor means further comprises means for communicating between separate physical locations information related to the building control system design.

91. The system of claim 52 wherein the processor means comprises word processor means for generating alpha-numeric information related to a building control system design.

92. The system of claim 91 wherein the processor means further comprises means for communicating between separate physical locations information related to the building control system design.

93. The system of claim 52 wherein the processor means comprises digitizer means comprising a surface and a pen, movement of the pen over the surface translating to movement of a position indicator on the display, the digitizer means facilitating use of the prompt and the means for creating a modified drawing.

94. The system of claim 93 wherein the digitizer means comprises an overlay covering the surface, the overlay comprising a menu listing of alpha-numeric identifier and editing choices related to the building control system element for facilitating use of the means for calling up and the means for creating.

95. The system of claim 52 wherein the processor means further comprises means for identifying and selecting accessories related to the building control system design.

96. The system of claim 95 wherein the processor means further comprises means for ordering devices for use in installing a building control system at a customer location.

97. The system of claim 96 wherein the processor means further comprises means for communicating between separate physical locations information related to the building control system design.

98. The system of claim 52 wherein the prompt related to the element comprises a first menu comprising a list of alpha-numeric identifier choices related to the element and a second menu comprising a list of quantity choices related to the element.

99. The system of claim 98 wherein the means for creating a modified drawing comprises means for adding an additional element to the initial drawing by selecting the additional element from the first menu list.

100. The system of claim 98 wherein the means of creating a modified drawing comprises means for replacing a first element in the initial drawing with a second element listed in the first menu.

101. The system of claim 98 wherein the means for creating a modified drawing comprises means for deleting an element from the initial drawing by using the first menu.

* * * * *

UNITED STATES PATENT AND TRADEMARK OFFICE
CERTIFICATE OF CORRECTION

PATENT NO. : 4,885,694

DATED : December 5, 1989

INVENTOR(S) : Robert H. Pray, Donald W. Ramler, Curtis B. Juliber

It is certified that error appears in the above-identified patent and that said Letters Patent is hereby corrected as shown below:

Column 21, line 67, delete "for" and insert --of--.

Column 24, line 67, delete "51" and insert --52--.

Signed and Sealed this

Nineteenth Day of November, 1991

Attest:

HARRY F. MANBECK, JR.

*Attesting Officer*   *Commissioner of Patents and Trademarks*